US012787851B2

(12) United States Patent
Elsherbini et al.

(10) Patent No.: US 12,787,851 B2
(45) Date of Patent: Nov. 3, 2026

(54) LASER ASSISTED ETCHING OF DIELECTRICS IN IC DEVICES

(71) Applicant: Intel Corporation, Santa Clara, CA (US)

(72) Inventors: Adel Elsherbini, Chandler, AZ (US); Shawna Liff, Scottsdale, AZ (US); Kimin Jun, Portland, OR (US); Veronica Strong, Hillsboro, OR (US); Aleksandar Aleksov, Chandler, AZ (US); Jiraporn Seangatith, Chandler, AZ (US); Mohammad Enamul Kabir, Portland, OR (US); Johanna Swan, Scottsdale, AZ (US); Tushar Talukdar, Wilsonville, OR (US); Omkar Karhade, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 17/891,530

(22) Filed: Aug. 19, 2022

(65) Prior Publication Data

US 2024/0063072 A1 Feb. 22, 2024

(51) Int. Cl.

*H10W 74/10* (2026.01)
*H10W 70/65* (2026.01)
(Continued)

(52) U.S. Cl.

CPC ......... *H10W 74/121* (2026.01); *H10W 70/65* (2026.01); *H10W 74/014* (2026.01);
(Continued)

(58) Field of Classification Search

CPC ....... H01L 21/033–0338; H01L 21/314–3185; H01L 21/76802; H01L 21/0337;
(Continued)

(56) References Cited

U.S. PATENT DOCUMENTS 5,272,104 A 12/1993 Schrantz et al.
6,211,463 B1 4/2001 Fabis
(Continued)

FOREIGN PATENT DOCUMENTS

CN 205039151 2/2016
CN 111627887 9/2020

OTHER PUBLICATIONS

Laser-assisted etching of borosilicate glass in potassium hydroxide David Bischof, * Michael Kahl, and Markus Michler OST Eastern Switzerland University of Applied Sciences, Buchs, Switzerland, vol. 11, No. 4 / Apr. 1, 2021 / Optical Materials Express, pp. 1185-1195 (Year: 2021).*
(Continued)

*Primary Examiner* — Christine S. Kim
*Assistant Examiner* — Andrew Victor Prostor
(74) *Attorney, Agent, or Firm* — Essential Patents Group, LLP

(57) ABSTRACT

Composite integrated circuit (IC) device processing, including selective removal of inorganic dielectric material. Inorganic dielectric material may be deposited, modified with laser exposure, and selectively removed. Laser exposure parameters may be adjusted using surface topography measurements. Inorganic dielectric material removal may reduce surface topography. Vias and trenches of varying size, shape, and depth may be concurrently formed without an etch-stop layer. A composite IC device may include an IC die, a conductive via, and a conductive line adjacent a compositionally homogenous inorganic dielectric material.

13 Claims, 24 Drawing Sheets

(51) Int. Cl.

| | |
|---|---|
| ***H10W 74/01*** | (2026.01) |
| ***H10W 74/43*** | (2026.01) |
| ***H10W 90/00*** | (2026.01) |
| *H10W 74/00* | (2026.01) |
| *H10W 74/40* | (2026.01) |

(52) U.S. Cl.
CPC ........ *H10W 74/019* (2026.01); *H10W 74/117* (2026.01); *H10W 74/43* (2026.01); *H10W 90/00* (2026.01); *H10W 90/701* (2026.01); *H10W 74/00* (2026.01); *H10W 74/127* (2026.01); *H10W 74/40* (2026.01); *H10W 90/401* (2026.01); *H10W 90/792* (2026.01); *H10W 90/794* (2026.01)

(58) Field of Classification Search
CPC ....... H01L 21/02354; H01L 21/02345–02351; H01L 21/0275; H01L 23/3135
See application file for complete search history.

(56) References Cited

U.S. PATENT DOCUMENTS

| | | | |
|---|---|---|---|
| 6,486,954 | B1 | 11/2002 | Mieher et al. |
| 6,570,362 | B1 | 5/2003 | Estes et al. |
| 7,030,772 | B1 | 4/2006 | Lee et al. |
| 8,584,061 | B2 | 11/2013 | Shibata et al. |
| 9,219,042 | B2 | 12/2015 | Paek et al. |
| 9,275,929 | B2 | 3/2016 | Liou et al. |
| 9,324,698 | B2 | 4/2016 | Yu et al. |
| 9,368,479 | B2 | 6/2016 | Katkar et al. |
| 9,396,997 | B2 | 7/2016 | Hirler et al. |
| 9,418,967 | B2 | 8/2016 | Koshiishi et al. |
| 9,570,399 | B2 | 2/2017 | Yang et al. |
| 9,589,945 | B2 | 3/2017 | Jo et al. |
| 9,978,694 | B2 | 5/2018 | Cho et al. |
| 10,026,715 | B2 | 7/2018 | Kume et al. |
| 10,157,892 | B1 | 12/2018 | Chen et al. |
| 10,276,544 | B2 | 4/2019 | Matsumoto et al. |
| 10,290,571 | B2 | 5/2019 | Yu et al. |
| 10,312,201 | B1 | 6/2019 | Hu et al. |
| 10,347,598 | B2 | 7/2019 | Baek et al. |
| 10,381,298 | B2 | 8/2019 | Yu et al. |
| 10,381,326 | B2 | 8/2019 | Woychik et al. |
| 10,510,650 | B2 | 12/2019 | Yu et al. |
| 11,094,672 | B2 | 8/2021 | Elsherbini et al. |
| 11,195,817 | B2 | 12/2021 | Huang et al. |
| 11,387,222 | B2 | 7/2022 | Yu et al. |
| 12,068,234 | B2 | 8/2024 | Chen et al. |
| 12,272,568 | B2 | 4/2025 | Chen et al. |
| 2002/0074649 | A1 | 6/2002 | Chrysler et al. |
| 2002/0141155 | A1 | 10/2002 | Pinneo |
| 2006/0043367 | A1 | 3/2006 | Chang et al. |
| 2006/0113546 | A1 | 6/2006 | Sung |
| 2008/0246126 | A1 | 10/2008 | Bowles et al. |
| 2009/0134500 | A1 | 5/2009 | Kuo |
| 2009/0174050 | A1 | 7/2009 | Bernstein et al. |
| 2012/0061827 | A1 | 3/2012 | Fujita |
| 2013/0134548 | A1 | 5/2013 | Torii |
| 2013/0139524 | A1 | 6/2013 | Kim et al. |
| 2013/0221493 | A1* | 8/2013 | Kim .................... H01L 21/6835 257/774 |
| 2013/0250527 | A1 | 9/2013 | Hatanaka et al. |
| 2014/0070407 | A1 | 3/2014 | Lee et al. |
| 2014/0231815 | A1 | 8/2014 | Railkar et al. |
| 2014/0264772 | A1 | 9/2014 | Horng et al. |
| 2014/0293543 | A1 | 10/2014 | Kim et al. |
| 2015/0200153 | A1 | 7/2015 | Wang et al. |
| 2016/0093533 | A1 | 3/2016 | Yow et al. |
| 2017/0084544 | A1 | 3/2017 | Chen |
| 2017/0092561 | A1 | 3/2017 | Eid et al. |
| 2017/0207197 | A1 | 7/2017 | Yu et al. |
| 2017/0213766 | A1 | 7/2017 | Kitayama |
| 2018/0158744 | A1 | 6/2018 | Song et al. |
| 2018/0158749 | A1 | 6/2018 | Yu et al. |
| 2018/0240756 | A1 | 8/2018 | Foo et al. |
| 2019/0051612 | A1 | 2/2019 | Kim et al. |
| 2019/0096868 | A1 | 3/2019 | Tsou et al. |
| 2019/0103390 | A1 | 4/2019 | Chen et al. |
| 2019/0139896 | A1 | 5/2019 | Hsu et al. |
| 2019/0244947 | A1 | 8/2019 | Yu et al. |
| 2019/0393190 | A1 | 12/2019 | Delacruz et al. |
| 2019/0393192 | A1 | 12/2019 | Eid et al. |
| 2019/0393193 | A1 | 12/2019 | Eid et al. |
| 2020/0091029 | A1 | 3/2020 | Jeng et al. |
| 2020/0105639 | A1 | 4/2020 | Valavala et al. |
| 2020/0185330 | A1 | 6/2020 | Yu et al. |
| 2020/0211920 | A1 | 7/2020 | Lee et al. |
| 2020/0312741 | A1 | 10/2020 | Wan et al. |
| 2020/0312774 | A1 | 10/2020 | Yu et al. |
| 2020/0335480 | A1 | 10/2020 | Hwang et al. |
| 2021/0020601 | A1 | 1/2021 | Chen et al. |
| 2021/0066279 | A1 | 3/2021 | Yu et al. |
| 2021/0096311 | A1 | 4/2021 | Yu et al. |
| 2021/0098422 | A1 | 4/2021 | Elsherbini et al. |
| 2021/0118756 | A1 | 4/2021 | Wan et al. |
| 2021/0118770 | A1 | 4/2021 | Kuo et al. |
| 2021/0159179 | A1 | 5/2021 | Elsherbini et al. |
| 2021/0193567 | A1 | 6/2021 | Cheah et al. |
| 2021/0375830 | A1 | 12/2021 | Elsherbini |
| 2021/0407932 | A1 | 12/2021 | Kabir et al. |
| 2022/0037281 | A1 | 2/2022 | Elsherbini et al. |
| 2022/0157691 | A1 | 5/2022 | Sharfi et al. |
| 2022/0310411 | A1 | 9/2022 | Chen et al. |
| 2022/0310501 | A1 | 9/2022 | Wang et al. |
| 2022/0344233 | A1 | 10/2022 | Chang |
| 2022/0406751 | A1 | 12/2022 | Elsherbini et al. |
| 2023/0067349 | A1 | 3/2023 | Lin et al. |
| 2023/0115745 | A1 | 4/2023 | Wang et al. |
| 2023/0154825 | A1 | 5/2023 | Tong |
| 2023/0369070 | A1 | 11/2023 | Ho et al. |
| 2024/0008184 | A1 | 1/2024 | Kuo et al. |
| 2024/0063142 | A1 | 2/2024 | Elsherbini et al. |
| 2024/0153840 | A1 | 5/2024 | Jeng et al. |
| 2024/0222215 | A1 | 7/2024 | Chen et al. |
| 2025/0349642 | A1 | 11/2025 | Wang et al. |

OTHER PUBLICATIONS

Etching-assisted femtosecond laser modification of hard materials Xue-Qing Liu1, Ben-Feng Bai1, Qi-Dai Chen2 and Hong-Bo Sun1,2*, Opto-Electronic Advances vol. 2, No. 9 (Year: 2019).*

Jani, I., et al., “Innovative structures to test bonding alignment and characterize high density interconnects in 3D-IC”, 15th IEEE International New Circuits and Systems Conference (NEWCAS), 2017, pp. 153-156.

Bischof, David et al., “Laser-assisted etching of borosilicate glass in potassium hydroxide,” Optical Materials Express, vol. 11, No. 4, Apr. 1, 2021, 11 pgs.

* cited by examiner

LASER ASSISTED ETCHING OF DIELECTRICS IN IC DEVICES

BACKGROUND

Monolithic integrated circuit (IC) fabrication has restrictions that may limit a final product's performance, and thus different versions of IC die (dis)integration are being investigated. To date however, these techniques and architectures generally suffer from certain drawbacks such as high cost, lower insertion efficiency, and increased z-height.

IC die disintegration techniques rely on advances in multi-die integration at the package level or at a level between monolithic IC die fabrication and packaging. IC die packaging is a stage of semiconductor device fabrication in which an IC that has been fabricated on a chip (or die) comprising a semiconducting material is assembled into a "package" that can protect the IC chip from physical damage and support electrical contacts that connect the IC to a scaled host component, such as an organic package substrate, or a printed circuit board. Multiple chips can be similarly assembled together, for example, into a multi-chip package (MCP).

Multi-chip architectures may advantageously combine IC chips from heterogeneous silicon processes and/or combine small dis-aggregated chips from identical silicon processes. However, there are many challenges with integrating multiple IC die into chip-scale units. For example, portions of inter-die fill material deposited over a composite or quasi-monolithic multi-chip structure may need to be removed to improve planarization or to form metallization features.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements, e.g., with the same or similar functionality. The disclosure will be described with additional specificity and detail through use of the accompanying drawings.

DETAILED DESCRIPTION

Figure 1:
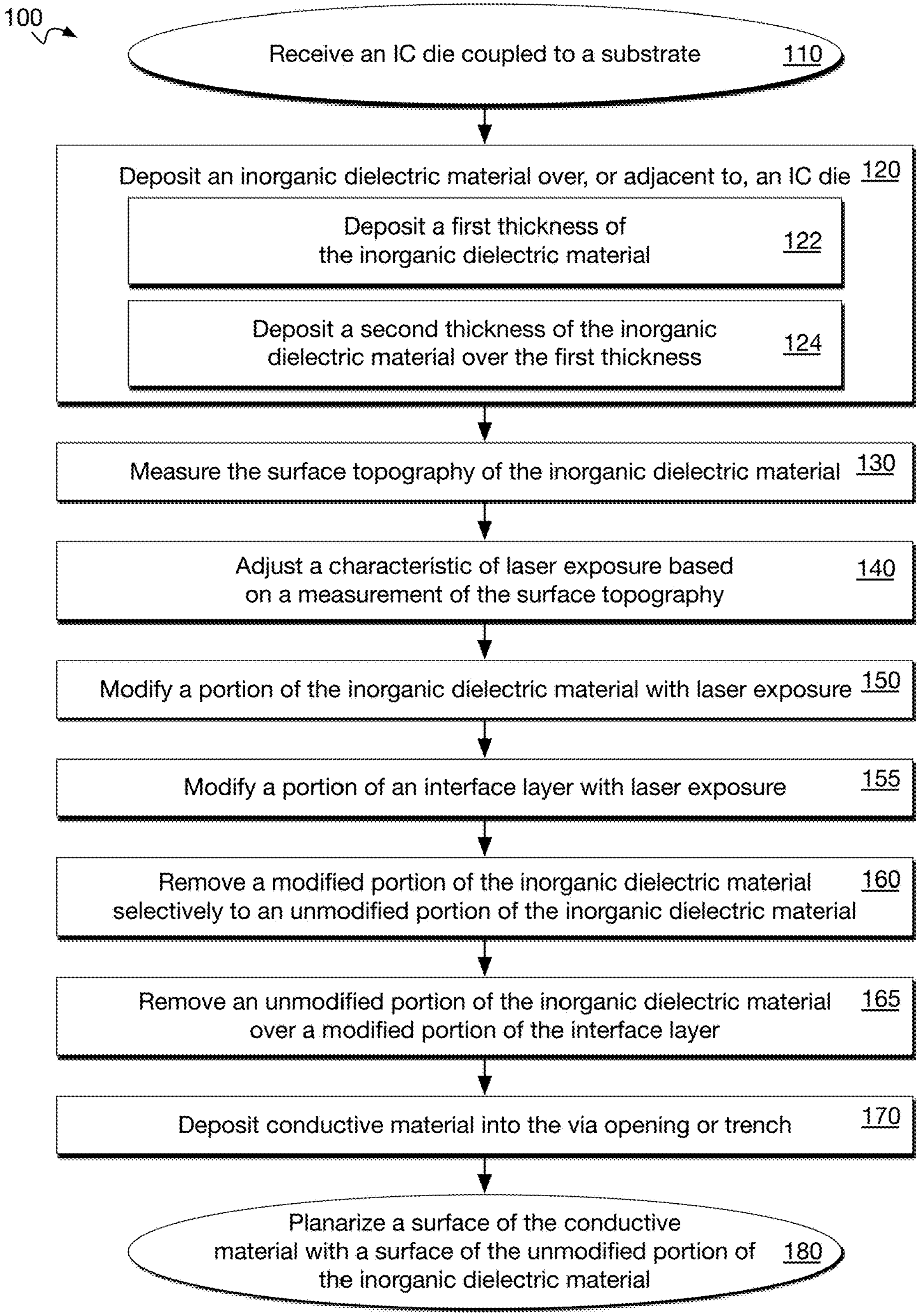
FIG. 1 is a flow chart of methods for forming a composite integrated circuit (IC) device, including a selective removal inorganic dielectric material, in accordance with some embodiments.

In the following detailed description, reference is made to the accompanying drawings that show, by way of illustration, specific embodiments in which the claimed subject matter may be practiced. These embodiments are described in sufficient detail to enable those skilled in the art to practice the subject matter. The various embodiments, although different, are not necessarily mutually exclusive. For example, a particular feature, structure, or characteristic described herein, in connection with one embodiment, may be implemented within other embodiments without departing from the spirit and scope of the claimed subject matter.

References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled.

The terms "over," "to," "between," and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The terms "coupled" and "connected," along with their derivatives, may be used herein to describe structural relationships between components. These terms are not intended as synonyms for each other. Rather, in particular embodiments, “connected” may be used to indicate that two or more elements are in direct physical or electrical contact with each other. “Coupled” may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The term “circuit” or “module” may refer to one or more passive and/or active components that are arranged to cooperate with one another to provide a desired function. The term “signal” may refer to at least one current signal, voltage signal, magnetic signal, or data/clock signal. The meaning of “a,” “an,” and “the” include plural references. The meaning of “in” includes “in” and “on.”

The vertical orientation is in the z-direction and recitations of “top,” “bottom,” “above,” and “below” refer to relative positions in the z-dimension with the usual meaning. However, embodiments are not necessarily limited to the orientations or configurations illustrated in the figure.

The terms “substantially,” “close,” “approximately,” “near,” and “about,” generally refer to being within +/−10% of a target value (unless specifically specified). Unless otherwise specified in the specific context of use, the term “predominantly” means more than 50%, or more than half. For example, a composition that is predominantly a first constituent means more than half of the composition is the first constituent. The term “primarily” means the most, or greatest, part. For example, a composition that is primarily a first constituent means the composition has more of the first constituent than any other constituent. A composition that is primarily first and second constituents means the composition has more of the first and second constituents than any other constituent.

Unless otherwise specified the use of the ordinal adjectives “first,” “second,” and “third,” etc., to describe a common object, merely indicate that different instances of like objects to which are being referred and are not intended to imply that the objects so described must be in a given sequence, either temporally, spatially, in ranking or in any other manner.

For the purposes of the present disclosure, phrases “A and/or B” and “A or B” mean (A), (B), or (A and B). For the purposes of the present disclosure, the phrase “A, B, and/or C” means (A), (B), (C), (A and B), (A and C), (B and C), or (A, B and C).

Views labeled “cross-sectional,” “profile,” and “plan” correspond to orthogonal planes within a cartesian coordinate system. Thus, cross-sectional and profile views are taken in the x-z and y-z planes, and plan views are taken in the x-y plane. Typically, profile views in the x-z plane are cross-sectional views. Where appropriate, drawings are labeled with axes to indicate the orientation of the figure.

Materials, structures, and techniques are disclosed to improve the packaging of integrated circuit (IC) dies in composite integrated circuit devices. Composite IC devices include at least one IC die directly bonded to a host substrate and inorganic dielectric material over or adjacent the IC die. Composite IC devices may include any number of IC dies and may also be referred to as “quasi-monolithic” because the structures lack a solder-based joining material that is typically found in IC die packaging. As such, an IC die may include a fully-functional IC, or may have circuitry of more limited functionality, in which case the die is sometimes referred to as a chiplet or tile. Within a composite multi-die structure, circuitry within one die, chiplet or tile may supplement the function of one or more other IC dies, chiplets, or tiles.

Quasi-monolithically integrated die structures including an IC die directly bonded to a host substrate may be covered with an inorganic gap fill material. The inorganic fill materials described herein have benefits over organic, packaging materials. For example, inorganic dielectric material can withstand higher temperatures, such as those employed in anneals, hybrid or direct bonding of IC die, and other fabrication processes, including many metallization processes. Inorganic dielectric materials are generally stronger and more resistant to moisture, which enables, e.g., encapsulating, bonding, stacking, etc., IC dies in hermetically packaged composite IC devices. Relative to organic materials, most inorganic dielectric materials transfer heat better, which assists in thermal dissipation from heat generating IC dies. Inorganic dielectric materials can also reduce stresses associated with thermal expansion by more closely matching the expansion coefficients of the IC dies of a composite structure.

However, inorganic dielectric material thicknesses may exceed many tens of microns when employed within multi-chip composite structures. Such thicknesses can be challenging to polish, e.g., with chemical-mechanical polishing (CMP), or etch. However, purely mechanical grinding could introduce reliability issues, e.g., micro-cracking. Many alternative laser-based ablation techniques are also too slow and can cause deformation, e.g., blistering of the workpiece.

As described further below, a laser exposure is employed to modify inorganic dielectric material, for example by altering a microstructure of the material. The modification allows the inorganic dielectric material to be selectively removed with a wet etch. This method can be applied to quickly reduce topography (e.g., substantially planarize mesas over IC dies); form deep via holes; form fine and shallow features concurrently with large and deep features; form deep trenches between composite IC devices for singulation; and form complex (including underhanging) voids suitable for backfilling with one or more conductive materials (e.g., for spiral inductors). For example, a single void can be formed in a compositionally homogenous region of inorganic dielectric material, e.g., without an etch-stop layer. The single void may then be filled with a conductive material to form both a conductive via and connected conductive line.

FIG. 1 is a flow chart of methods 100 for forming an IC device, including a selective removal of inorganic dielectric material, in accordance with some embodiments. Methods 100 include operations 110-180. Some operations shown in FIG. 1 are optional. FIG. 1 shows an example sequence, but the operations can be done in other orders as well, and some operations may be omitted. Some operations can also be performed multiple times before other operations are performed. For example, inorganic dielectric material can be deposited and modified multiple times, and operations 120 and 150 may be repeated, before any modified inorganic dielectric material is removed in operation 160. Some operations may be included within other operations.

Methods 100 generally entail depositing inorganic dielectric material over, adjacent, or near an IC die; modifying a portion of the inorganic dielectric material with laser exposure; and selectively removing the modified inorganic dielectric material while retaining unmodified inorganic dielectric material. In some embodiments, modifying and selectively removing modified inorganic dielectric material reduces surface topography of the inorganic dielectric material. In some such embodiments, the modified and removed inorganic dielectric material is between IC dies. In some embodiments, the modified and removed inorganic dielectric material is over an IC die. In some embodiments, the inorganic dielectric material surface topography is measured and the topography measurements are used to modify one or more characteristics of the laser exposure, e.g., exposure area, laser intensity, or focus depth. In some embodiments, a conductive material is formed in an opening created by removing modified inorganic dielectric material, and a surface of the conductive material is planarized with a surface of the retained inorganic dielectric material. Examples of IC devices at various stages of manufacture, e.g., between and during the operations of methods 100, will be shown in the following figures.

Methods 100 begin at operation 110 with the receipt of an IC die coupled to a substrate. In some embodiments, the IC die is coupled to a substrate coupled to other IC dies. In some embodiments, the substrate is an IC die or a chiplet or tile of more limited functionality, for example. The host substrate may also be a passive die lacking any transistors and/or device layer. The host substrate may also be any other structure known to be suitable as a package substrate or interposer. The IC die may be electrically connected to the substrate, e.g., with metallization structures of the IC die hybrid bonded to metallization structures of the substrate. In some alternative embodiments, the substrate and IC die are not electrically connected. For example, the substrate may be a carrier or handle die from which the IC die will later be released.

At operation 120, an inorganic dielectric material is deposited over, or adjacent to, the IC die, which forms an IC device. The inorganic dielectric material may be formed by any suitable means. In some embodiments, the inorganic dielectric material is conformally deposited adjacent to or over the IC die, e.g., by chemical vapor deposition (CVD). In some embodiments, the inorganic dielectric material is deposited by plasma-enhanced CVD (PECVD). The inorganic dielectric material may be deposited over a single IC die or multiple IC dies. In some embodiments, deposition of the inorganic dielectric material forms a mesa over an individual one of the IC dies.

The inorganic dielectric material may be any suitable material. In some embodiments, the inorganic dielectric material includes predominantly silicon and oxygen, e.g., silicon dioxide ($SiO_2$).

FIGS. 2A, 2B, 2C, 2D, 2E, and 2F illustrate cross-sectional profile views of an IC device 200, including IC dies 210 and inorganic dielectric material 220, at various stages of manufacture, in accordance with some embodiments. FIGS. 2A-2F show a progression of structures where laser exposure is used to modify a portion of inorganic dielectric material 220 over IC die 210, the modified portion of inorganic dielectric material 220 over IC die 210 is selectively removed, and an unmodified portion of inorganic dielectric material 220 adjacent IC die 210 is retained, such that the surface topography of inorganic dielectric material 220 is reduced. The term "surface topography" refers to the three-dimensional quality of a surface, e.g., non-planar features of the surface, such as mesas. In some embodiments, reducing surface topography includes reducing the height or thickness of non-planar features of a surface of inorganic dielectric material 220. In some embodiments, reducing surface topography includes substantially planarizing a surface of inorganic dielectric material 220. The progression ends with IC device 200 having a substantially planar upper surface of IC dies 210 and inorganic dielectric material 220.

Figure 2A:
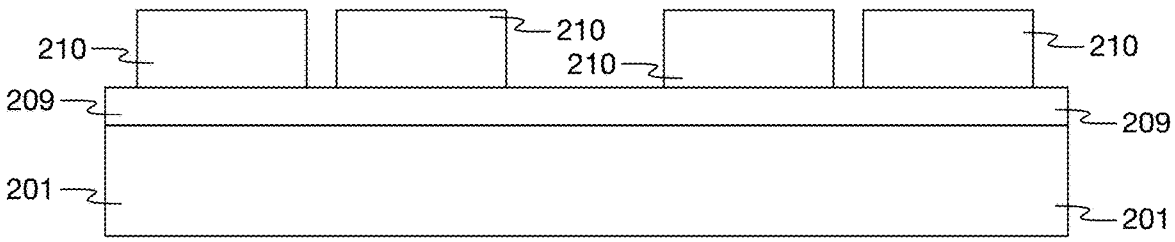
FIGS. 2A, 2B, 2C, 2D, 2E, and 2F illustrate cross-sectional profile views of an IC device, including IC dies and inorganic dielectric material, at various stages of manufacture, in accordance with some embodiments.

In FIG. 2A, multiple IC dies 210 are coupled to a substrate 201 at interface layer 209. In some embodiments, IC dies 210 are electrically connected to substrate 201 through interface layer 209. In some embodiments, interface layer 209 is an adhesive layer, e.g., a release layer. In some such embodiments, substrate 201 is a carrier or handle die.

Figure 2B:
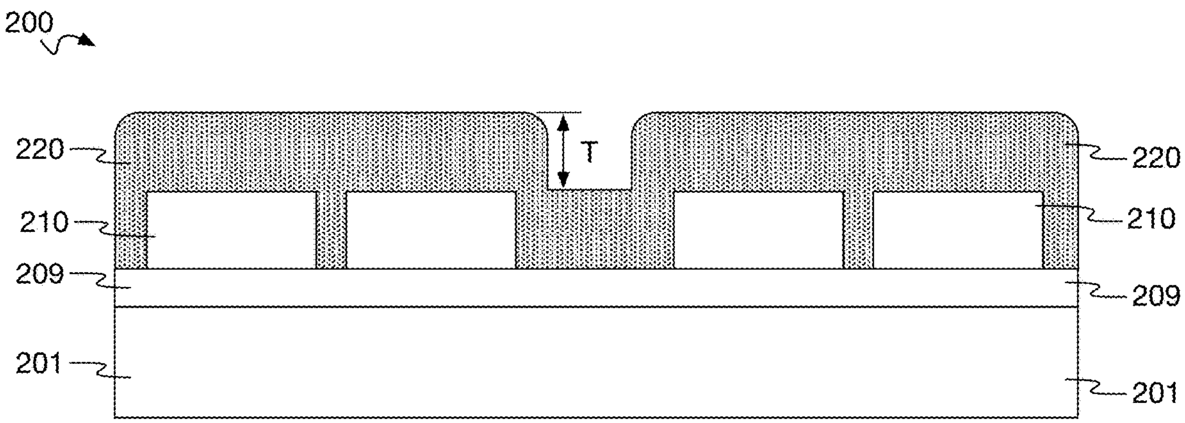

FIG. 2B shows IC device 200 with inorganic dielectric material 220 over the structures in FIG. 2A, IC dies 210 and substrate 201. Inorganic dielectric material 220 is substantially conformal over IC dies 210 and substrate 201, including elevated mesas of inorganic dielectric material 220 with a thickness T in the z direction over IC dies 210. These mesas may be planarized, for example, to couple IC device 200 to other structures, including similar layers of IC dies 210. In some embodiments, thickness T is 30 μm. In some embodiments, thickness T is 40 μm. In some embodiments, thickness T of deposited inorganic dielectric material 220 corresponds to a vertical height of IC dies 210, which can be shorter or taller. In some embodiments, thickness T is 10 μm. In some embodiments, thickness T is 50 μm.

Returning to FIG. 1, at operation 130 the surface topography of the inorganic dielectric material is measured. For example, the relative z heights of various points at, e.g., regular intervals in the x and y directions may be measured. The surface topography may be measured by any suitable means. In some embodiments, an interferometer or profilometer is used to characterize the surface topography.

At operation 140, one or more characteristics of a laser are adjusted based on the surface topography measurement. Such laser parameters can include, for example, laser intensity (e.g., power), duration, depth of focus, and exposure path/area. For example, a larger thickness of material may require a laser exposure of higher intensity, longer duration, longer wavelength, and/or progressively lower focus depths.

At operation 150, a portion of the inorganic dielectric material is modified through exposure to one or more lasers. Rather than ablate the inorganic dielectric material, the laser exposure can modify the microstructure of the selected portions of the inorganic dielectric material to be removed. The modification forms nanoporosities in the inorganic dielectric material and allows the material to be selectively removed with a wet etch. Inorganic dielectric material with nanoporosity modifications to its microstructure can be etched with a solution in which the material is otherwise stable. For example, silicon dioxide is usually stable in potassium hydroxide solutions, but modified silicon dioxide can be etched by potassium hydroxide with a selectivity of greater than 500 relative to unmodified silicon dioxide. Laser exposure parameters (e.g., pulse duration, pulse energy, pulse repetition rates, etc.) can be adjusted, for example, balanced, to modify the inorganic dielectric material, but without causing unwanted changes to the structure. In exemplary embodiments, the laser is an ultrashort (e.g., picosecond) pulsed laser. In some such embodiments, laser exposures with pulse durations of around 5 ps are used. In some embodiments, laser exposures have pulse energies of greater than 1000 nJ. Pulse repetition rates of less than 250 kHz may be used. In some embodiments, laser exposures with pulse repetition rates of 105 kHz are used. In some embodiments, laser exposures with pulse repetition rates of 52 kHz are used. The term "laser," an acronym for "light amplification by stimulated emission of radiation," as used here includes electromagnetic radiation with wavelengths (and frequencies) beyond both ends of the visible spectrum of light: up to at least around 1 mm (or down to around 300 GHz) and down to at least around 10 nm (or up to around 30 PHz). For example, laser exposure includes exposure to infrared (IR) electromagnetic radiation. In some exemplary embodiments, laser exposure includes exposure to electromagnetic radiation with a wavelength in the near-IR range. In some such embodiments, laser exposure includes exposure to electromagnetic radiation with a wavelength of around 1030 nm.

Penetration of laser exposure can be modulated using multiple wavelengths (or tones), e.g., binary tones or grayscale, or phase-shifted laser exposure. In some embodiments, a minimum feature size, such as a laser spot size, is reduced using multiple wavelengths of laser exposure. One or more exposure templates may be used to confine or direct the laser exposure to precisely targeted areas and volumes and with the desired intensity. Exposure templates can block or mask undesired laser exposure, and control diffraction of laser exposure, of the inorganic dielectric material. For example, laser exposure may be resolved to finer features by directing illumination through an exposure template between a laser source and the inorganic dielectric material. In some embodiments, features smaller than typical laser spot sizes are resolved using an exposure template. In some such embodiments, more than one exposure template is used for a same feature, e.g., multiple laser exposures. In some embodiments, multiple wavelengths of laser exposure are used in combination with multiple exposure templates.

Portions of the inorganic dielectric material that are to be retained are not modified. In some embodiments, laser exposure modifies a portion of inorganic dielectric material over an IC die, and a portion of inorganic dielectric material adjacent an IC die is unmodified. As discussed, laser parameters can be adjusted to ensure only selected portions of the inorganic dielectric material are modified, e.g., only targeted areas and to the proper depths. In some embodiments, a galvanometer-controlled laser is precisely controlled using an automated program based on input data from surface topography measurements of the inorganic dielectric material. In some such embodiments, surface topography of the inorganic dielectric material is measured prior to adjusting one or more laser exposure characteristics based at least in part on a characteristic indicative of the surface topography. In some embodiments, surface topography of the inorganic dielectric material is measured after modifying the inorganic dielectric material with laser exposure.

In the example of FIG. 2B, a mesa over any IC die 210 could be characterized as having a thickness T at (x, y) samples over and near an IC die 210. Such data could be used to control where a laser exposure is to occur, both the lateral area to target (e.g., over and near the certain IC die 210) and the laser depth of focus (e.g., to a depth of thickness T).

In some embodiments, areas with measurements meeting certain qualifications are mapped to receive a laser exposure at operation 150. For example, surface topographies with at least a certain thickness, e.g., T or 50% of T or 10% of T, might be targeted for laser exposure. In some embodiments, a laser is scanned across portions of the inorganic dielectric material, and areas with surface topographies of at least a certain height or thickness are scanned with the laser while other areas are not scanned. In some embodiments, a laser is scanned across portions of the inorganic dielectric material, and an intensity of the laser is adjusted based on a pre-programmed relationship between surface topography and intensity. For example, the laser intensity can be proportional to the thickness of the inorganic dielectric material above a certain value. Inorganic dielectric materials with a thickness of z=0 can be exposed at an intensity of zero (e.g., no exposure), the inorganic dielectric material with a maximum thickness can be exposed at a maximum intensity, and the inorganic dielectric material with intermediate thicknesses can be exposed at intensities proportional to their thicknesses.

In some embodiments, a focus depth of the laser is adjusted. For example, surface topographies may be exposed multiple times depending on the surface topography height and each successive exposure having a successively deeper depth of focus, e.g., at intervals of 5 μm. In the example of FIG. 2B, a mesa of thickness T could be scanned (T divided by 5 μm) times with focus depths of 5 μm, 10 μm, 15 μm, etc., from the upper surface down to a depth of T (level with the lowest thickness of the inorganic dielectric material at a base of the mesa).

Figure 2C:
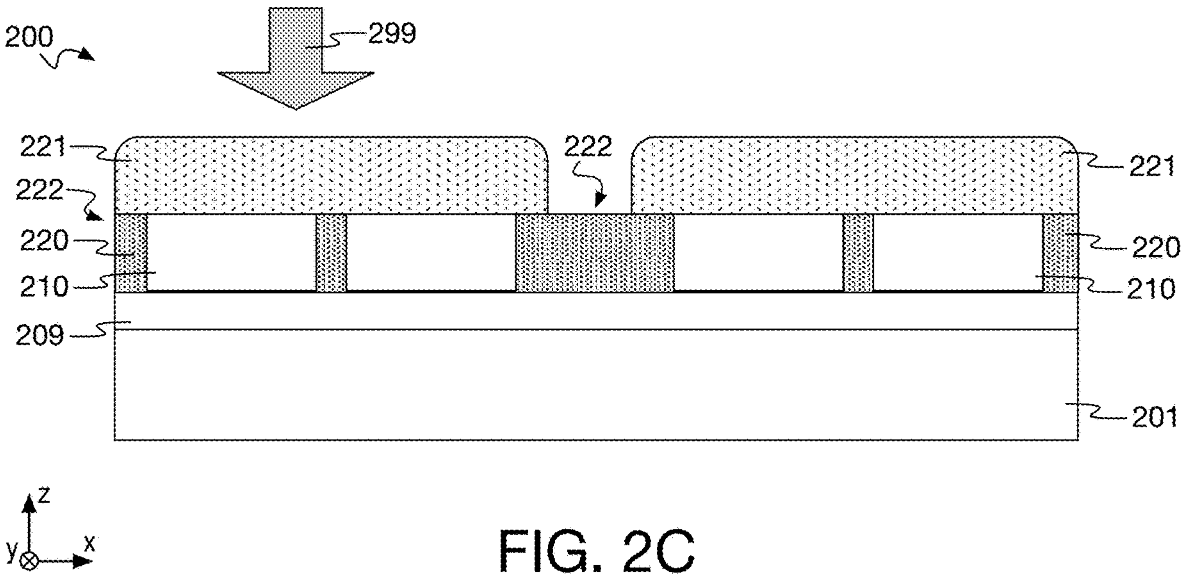

In FIG. 2C, IC device 200 is shown with modified portions of inorganic dielectric material 220, e.g., that have been exposed to laser energy (represented by arrow 299) and modified. Modified inorganic dielectric material 221 is over IC dies 210. Unmodified portions 222 of inorganic dielectric material 220 are adjacent and on both sides of IC dies 210, including under modified inorganic dielectric material 221.

Returning to FIG. 1, at operation 160 a modified portion of the inorganic dielectric material is removed selectively to an unmodified portion of the inorganic dielectric material that is retained. In some embodiments, a modified portion of inorganic dielectric material over an IC die is removed, and an unmodified portion of inorganic dielectric material adjacent an IC die is retained. After the microstructure of the inorganic dielectric material has been selectively modified by the laser exposure, modified portions of the inorganic dielectric material are removed, e.g., with a wet etch. In some embodiments, a chemical etch removes modified inorganic dielectric material using a solution including potassium hydroxide (KOH). Other etchants may be used.

Figure 2D:
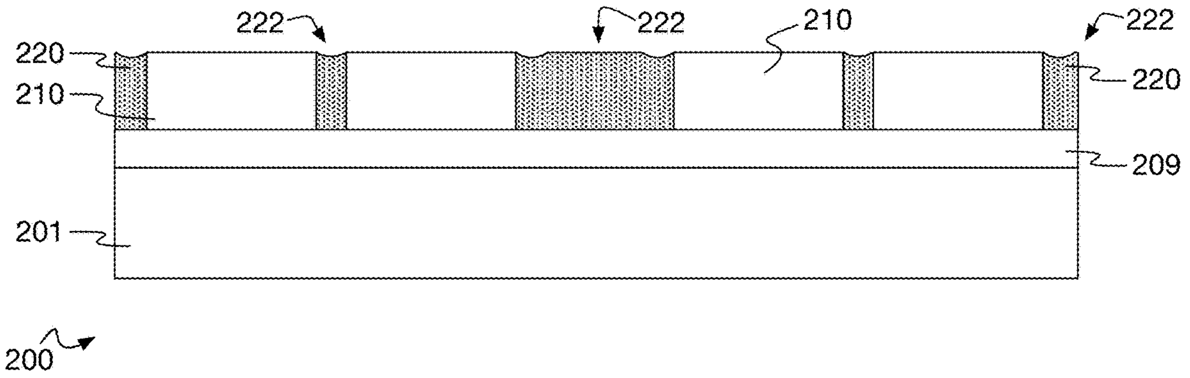

As shown in FIG. 2D, IC device 200 includes inorganic dielectric material 220 on both sides of, and on the same level as, IC dies 210. Unmodified portions 222 of inorganic dielectric material 220 remain on both sides of IC dies 210, and no modified inorganic dielectric material 221 remains. Removal of modified inorganic dielectric material 221 over IC die 210 has therefore reduced the surface topography of the inorganic dielectric material 220.

After the surface topography has been reduced and substantially planarized, some non-planar features may persist. In some embodiments, there may be small depressions in the upper surface of inorganic dielectric material 220 as a result of laser "impact," particularly where a large thickness of inorganic dielectric material 220 was modified. In some embodiments, additional inorganic dielectric material 220 is formed over the planarized inorganic dielectric material 220.

Figure 2E:
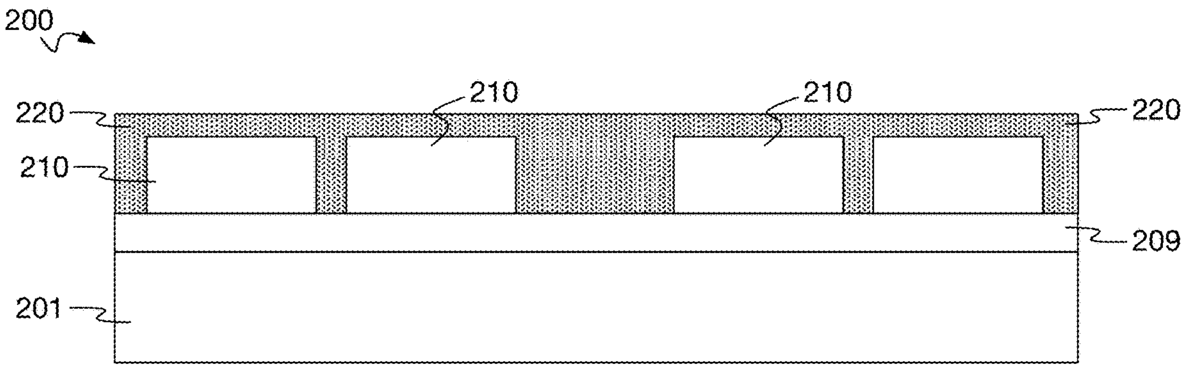

FIG. 2E illustrates IC device 200 with a thin layer of supplemental inorganic dielectric material 220 over IC dies 210. Such a layer may be deposited by any suitable means, e.g., CVD or PECVD.

Figure 2F:
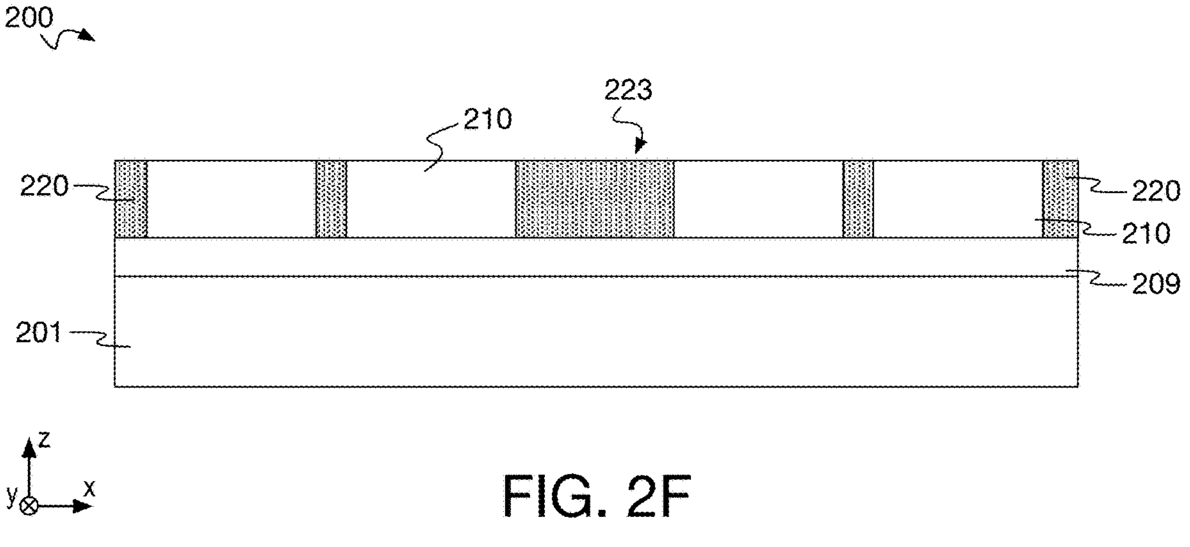

FIG. 2F shows IC device 200 with inorganic dielectric material 220 on both sides of IC dies 210 and a planar upper surface 223. In some embodiments, a surface of inorganic dielectric material 220 is substantially co-planar with a surface of IC dies 210.

Methods 100 of FIG. 1 can also utilize interface layers and operations 155 and 165 to manufacture an IC device with IC dies coupled to a substrate with inorganic dielectric material over the substrate and adjacent, but not over, the IC dies. Use of an interface layer, e.g., a release film, may add processing flexibility or reduce processing time, e.g., relative to etching.

FIGS. 3A, 3B, 3C, 3D, 3E, and 3F illustrate cross-sectional profile views of IC device 200, including IC dies 210, inorganic dielectric material 220, and interface layer 209, at various stages of manufacture, in accordance with some embodiments. FIGS. 3A-3F show a progression of structures where laser exposure is used to modify a portion of inorganic dielectric material 220 and a portion of interface layer 209 over IC die 210, the modified portion of inorganic dielectric material 220 is selectively removed, an unmodified portion of inorganic dielectric material 220 is removed with the modified portion of interface layer 209B, and an unmodified portion of inorganic dielectric material 220 adjacent IC die 210 is retained. An unmodified portion of interface layer 209A may also be retained. The progression ends with IC device 200 having inorganic dielectric material 220 adjacent IC dies 210 and without inorganic dielectric material 220 over IC dies 210.

Returning to FIG. 1 and using methods 100, a substrate coupled to multiple IC dies is received in operation 110. In some embodiments, IC dies are received with an interface layer, such as a release film, over the IC dies. In some embodiments, an interface layer is formed over the IC dies prior to coupling the IC dies with the substrate. In some embodiments, an interface layer is formed over the IC dies after receipt. The interface layer may be formed by any suitable means. In some embodiments, an interface layer is formed over sidewalls and an upper surface of the IC dies. In some embodiments, an interface layer is formed over only an upper surface of the IC dies.

Figure 3A:
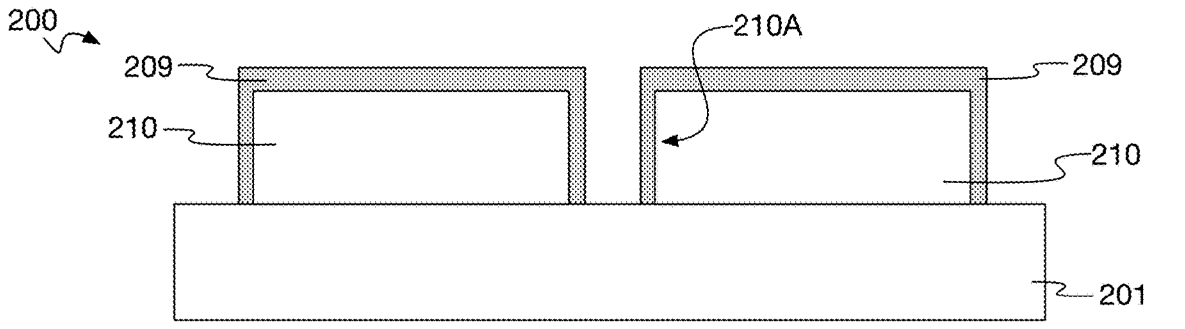
FIGS. 3A, 3B, 3C, 3D, 3E, and 3F illustrate cross-sectional profile views of an IC device, including IC dies, inorganic dielectric material, and interface layer, at various stages of manufacture, in accordance with some embodiments.

FIG. 3A shows received IC dies 210 coupled to substrate 201 in IC device 200. Interface layer 209 is adjacent and over IC dies 210. In some embodiments, interface layer 209 is over an upper surface of IC dies 210, but interface layer 209 is not over sidewalls 210A of IC dies 210. Interface layer 209 may be any suitable material. Interface layer 209 may be a material that bonds well with IC dies 210 and inorganic dielectric material 220, and be modifiable by laser exposure. Interface layer 209 may have good insulating qualities, e.g., a low absolute permittivity. In some embodiments, interface layer 209 has a relative dielectric constant of 3.9.

Returning to FIG. 1 and using operation 120, inorganic dielectric material is deposited over and adjacent the interface layer over and adjacent the IC dies. In some embodiments, inorganic dielectric material is deposited between IC dies. Inorganic dielectric material may be deposited substantially conformally and cover, e.g., the interface layer. In some embodiments, inorganic dielectric material is deposited over the interface layer on an upper surface of an IC die and over sidewalls of an IC die without an interface layer.

Figure 3B:
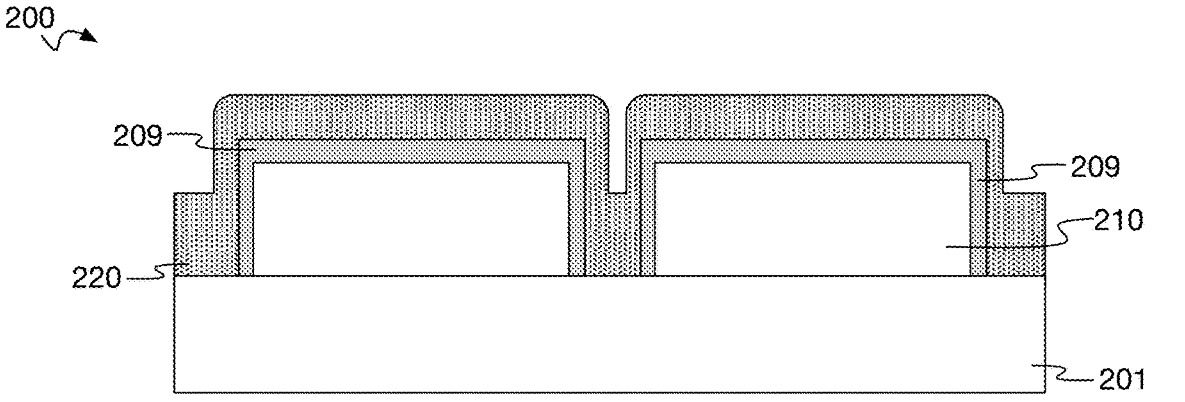

FIG. 3B shows inorganic dielectric material 220 over interface layer 209 over IC dies 210 and over substrate 201. In some embodiments, inorganic dielectric material 220 is coupled to interface layer 209 and substrate 201. In some embodiments, inorganic dielectric material 220 is coupled to interface layer 209, sidewalls 210A of IC dies 210, and substrate 201.

Returning to FIG. 1 and using methods 100, a portion of the interface layer is modified through exposure to a laser at operation 155. The modification may allow unmodified inorganic dielectric material over the modified interface layer to be removed without modification or etching. In some embodiments, the interface layer is modified concurrently with modification of inorganic dielectric material. Such modified inorganic dielectric material may be, e.g., adjacent an IC die. In some embodiments, a single laser is used to modify the interface layer and the inorganic dielectric material. In some embodiments, different lasers are used to modify the interface layer and the inorganic dielectric material. In some embodiments, a first laser is used to modify the interface layer through the inorganic dielectric material, which is transparent to the first laser, and a second laser is used to modify the inorganic dielectric material.

Figure 3C:
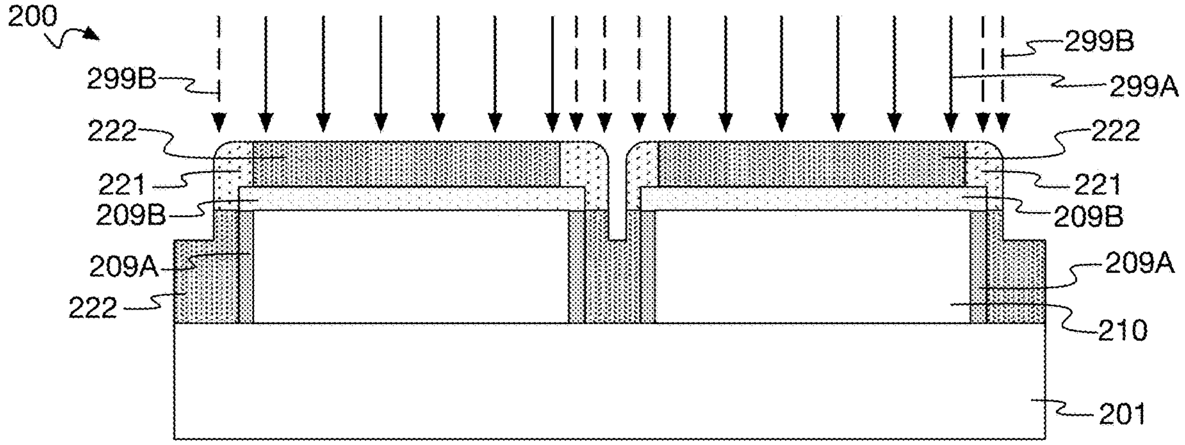

FIG. 3C shows laser energy 299A, 299B modifying interface layer 209 and inorganic dielectric material 220. In some embodiments, laser energy 299A (represented by solid arrows) is from a first laser and laser energy 299B (represented by dashed arrows) is from a second laser. Modified inorganic dielectric material 221 is over and adjacent unmodified portions 222 of inorganic dielectric material 220. Modified interface layer 209B is over and adjacent unmodified interface layer 209A. Modified interface layer 209B is over IC die 210, and unmodified portions 222 of inorganic dielectric material 220 are over modified interface layer 209B.

Returning to FIG. 1, at operation 160 a modified portion of the inorganic dielectric material may be removed selectively to an unmodified portion of the inorganic dielectric material that may be retained. One or more other operations may be performed after operation 150 and before operation 160. In some embodiments, operation 165 is performed after operation 155 and without an intervening operation 160.

Figure 3D:
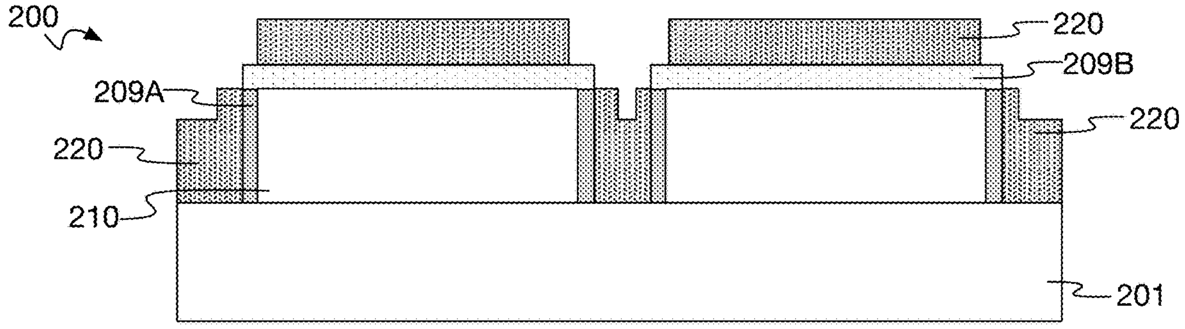

FIG. 3D shows IC dies 210 without modified inorganic dielectric material 221. Inorganic dielectric material 220 is over modified interface layer 209B and substrate 201, including between IC dies 210. Unmodified interface layer 209A is adjacent IC dies 210 and inorganic dielectric material 220.

Returning to FIG. 1 and using methods 100, a portion of the inorganic dielectric material over the modified portion of the interface layer is removed at operation 165. The inorganic dielectric material may be removed by any suitable means. In some embodiments, the inorganic dielectric material is removed by coupling to a removal structure lifting off the inorganic dielectric material. In some embodiments, the inorganic dielectric material is removed mechanically by friction or lateral motion, e.g., scraping or polishing, by a removal structure. In some embodiments, modified and unmodified portions of inorganic dielectric material over an interface layer are removed. In some embodiments, remaining portions of inorganic dielectric material or interface layer are removed, e.g., by CMP, following removal of portions of inorganic dielectric material or interface layer.

Figure 3E:
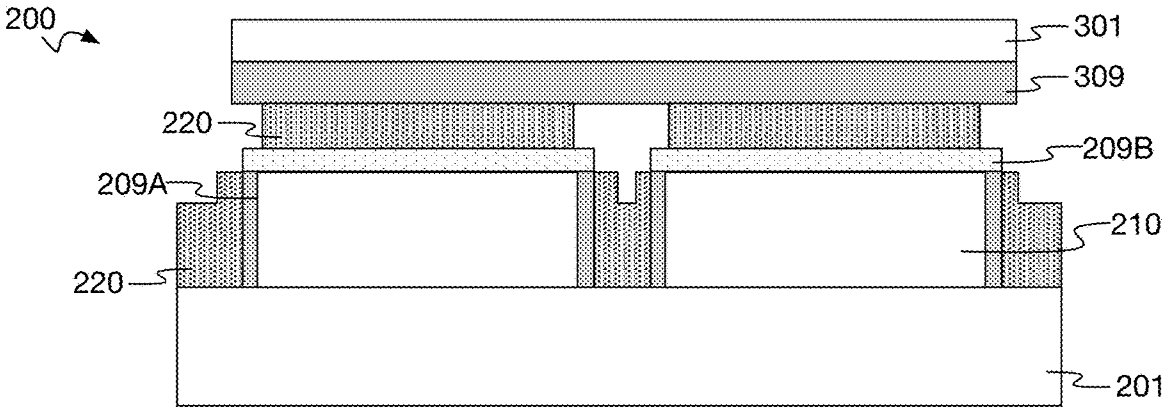

FIG. 3E shows inorganic dielectric material 220 over modified interface layer 209B (over IC dies 210) and substrate 201, and a removal structure 301 coupled to inorganic dielectric material 220 (over modified interface layer 209B) by a coupling layer 309. Unmodified interface layer 209A is adjacent IC dies 210 and inorganic dielectric material 220.

Coupling layer 309 may include any suitable material(s) to couple removal structure 301 to inorganic dielectric material 220. Advantageously, coupling layer 309 may strongly and elastically couple removal structure 301 and inorganic dielectric material 220. Such coupling provides sufficient strength to decouple inorganic dielectric material 220 from IC device 200, but with sufficient elasticity to not, e.g., fracture any insufficiently modified inorganic dielectric material 220. In some embodiments, coupling layer 309 includes an organic polymer. In some embodiments, coupling layer 309 includes one or more polymeric organosilicon compounds. In some embodiments, coupling layer 309 includes polydimethylsiloxane (PDMS).

Figure 3F:
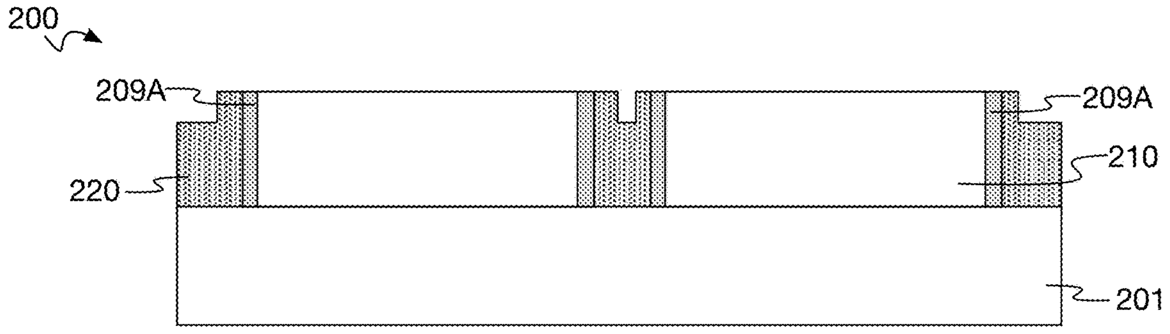

FIG. 3F shows IC device 200 with interface layer 209A adjacent IC dies 210 and inorganic dielectric material 220, including between IC dies 210. A planar upper surface of IC device 200 includes planar upper surfaces of inorganic dielectric material 220, interface layer 209A, and IC dies 210. As described above, further processing can include further deposition and planarization of inorganic dielectric material 220. The structures of IC device 200 can be included in composite IC devices, e.g., with one or more IC dies bonded on the planar upper surface of IC device 200 and/or with one or more conductive vias or conductive lines through inorganic dielectric material 220. Interface layers 209 may be included between IC dies 210 and inorganic dielectric material 220 in other embodiments.

Methods 100 (as shown in FIG. 1) can also enable denser IC devices by facilitating smaller die-to-die pitches by providing a process to fill narrow gaps between IC dies. Inorganic dielectric materials can be formed in a substantially conformal layer having a thickness of, e.g., 30-40 μm. However, when IC dies are placed too closely together (or the gap between them is too deep), for example, when the lateral distance between IC dies is 25% greater than the height of the IC dies, inorganic dielectric material formed on and above the sidewalls of the IC dies can interfere with deposition on the horizontal surface between the IC dies. For example, IC dies having heights of 40 μm will interfere with conformal deposition of inorganic dielectric material in a lateral gap of less than 50 μm between the IC dies. But with methods 100, operations 120, 150, and 160 can be repeated as necessary to iteratively deposit layers of inorganic dielectric material and modify and remove any portion of that inorganic dielectric material until, for example, inorganic dielectric material fills the inter-die gap up to an upper surface of the dies.

FIGS. 4A, 4B, 4C, 4D, 4E, 4F, 4G, 4H, and 4I illustrate cross-sectional profile views of an IC device 200, including IC dies 210 and inorganic dielectric material 220, at various stages of manufacture, in accordance with some embodiments. FIGS. 4A-4I show a progression of structures where inorganic dielectric material 220 is deposited, and the surface topography of inorganic dielectric material 220 between IC dies 210 is iteratively reduced. Inorganic dielectric material 220 is formed over and on the sides of IC dies 210, laser exposure modifies a portion of inorganic dielectric material 220 over and between IC dies 210, modified inorganic dielectric material 221 is selectively removed over and between IC dies 210, and unmodified portions 222 of inorganic dielectric material 220 between IC dies 210 are retained.

Returning to FIG. 1 and using methods 100, a substrate coupled to multiple IC dies is received in operation 110. The IC dies are coupled on an upper surface of the substrate and placed very closely. In some embodiments, the IC dies are separated laterally by a distance no more than 125% of the height of the shortest or thinnest of the IC dies. In some embodiments, the IC dies are separated laterally by a distance less than the height of the shorter of the IC dies.

In operation 120, inorganic dielectric material is deposited adjacent the IC dies on at least the sidewalls between the IC dies. In some embodiments, inorganic dielectric material is deposited over and between the IC dies and over the substrate on both sides of the IC dies.

Figure 4A:
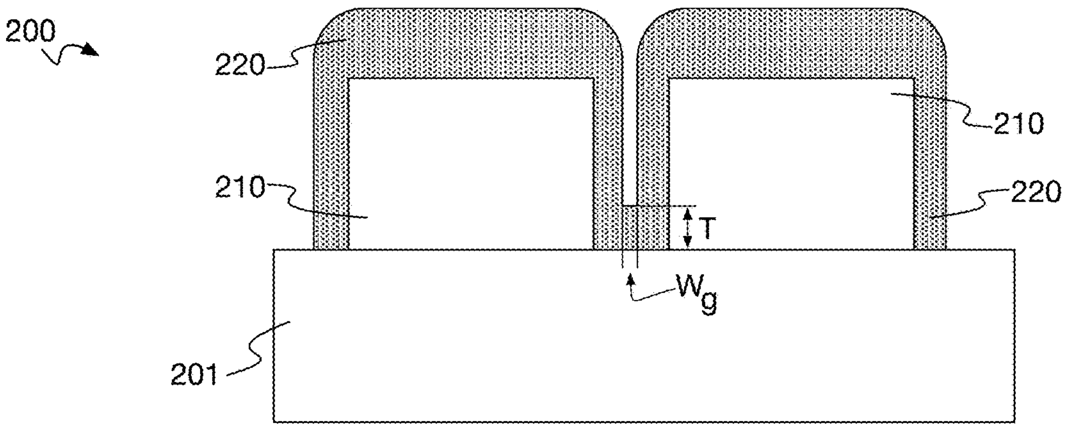
FIGS. 4A, 4B, 4C, 4D, 4E, 4F, 4G, 4H, and 4I illustrate cross-sectional profile views of an IC device, including IC dies and inorganic dielectric material, at various stages of manufacture, in accordance with some embodiments.

FIG. 4A shows IC device 200 with inorganic dielectric material 220 over IC dies 210 and substrate 201. Inorganic dielectric material 220 is over the tops and sidewalls of IC dies 210, including between IC dies 210 with a thickness T in the z direction over substrate 201. A gap of width $W_g$ is between inorganic dielectric material 220 adjacent to the sidewalls of IC dies 210. Gap width $W_g$ is insufficient to a pinch-off of inorganic dielectric material 220 between IC dies 210.

Returning to FIG. 1, a portion of the inorganic dielectric material between the IC dies is modified using laser exposure at operation 150. Advantageously, inorganic dielectric material in a horizontal layer over the substrate is left unmodified, and the portion modified includes at least enough inorganic dielectric material over the sidewalls between IC dies (above the unmodified, horizontal portion) to allow further inorganic dielectric material to be deposited over the substrate between IC dies after the modified portion is removed in operation 160. In some embodiments, inorganic dielectric material over the tops of the IC dies is also modified by laser exposure.

Figure 4B:
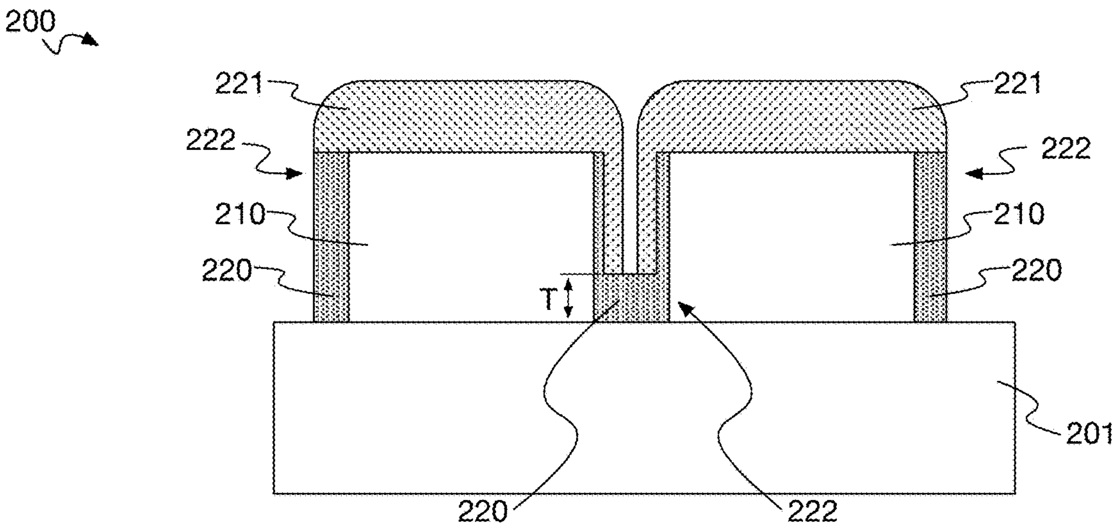

FIG. 4B shows IC device 200 with inorganic dielectric material 220 over and between IC dies 210 and substrate 201. Modified inorganic dielectric material 221 is over IC dies 210 and between IC dies 210. Unmodified portions 222 of inorganic dielectric material 220 remain on the sidewalls of IC dies 210. Notably, a horizontal, unmodified portion 222 of inorganic dielectric material 220 remains over substrate 201 between IC dies 210 with an undiminished thickness T.

Returning to FIG. 1, at operation 160 a modified portion of the inorganic dielectric material between the IC dies is removed selectively to an unmodified portion of the inorganic dielectric material. In some embodiments, a wet etch removes the modified portion of the inorganic dielectric material. In some such embodiments, the wet etch uses a solution including potassium hydroxide. Advantageously, an unmodified portion of inorganic dielectric material in a horizontal layer over the substrate is retained with an undiminished thickness T, and at least enough inorganic dielectric material over the sidewalls between IC dies (above the unmodified, horizontal portion) is removed to allow further inorganic dielectric material to be deposited over the substrate between IC dies. In some embodiments, modified portions of inorganic dielectric material at a level higher than the tops of the IC dies are removed.

Figure 4C:
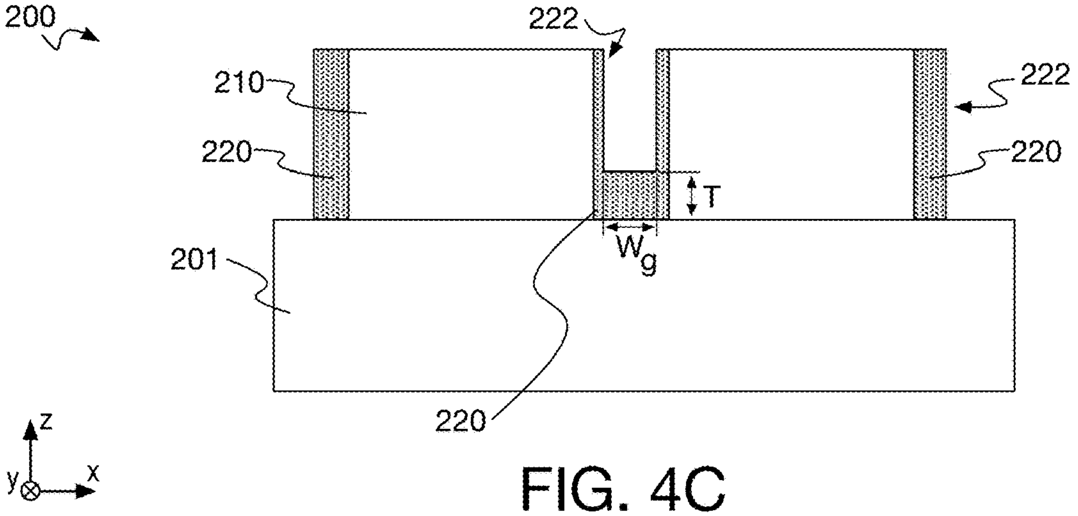

FIG. 4C shows IC device 200 with inorganic dielectric material 220 over and between IC dies 210 and substrate 201. Unmodified portions 222 of inorganic dielectric material 220 remain on the sidewalls of IC dies 210. Notably, a horizontal, unmodified portion 222 of inorganic dielectric material 220 remains over substrate 201 between IC dies 210 with an undiminished thickness T. Gap width $W_g$ is great enough to allow further deposition of inorganic dielectric material 220 between IC dies 210.

Returning to FIG. 1, operations 120, 150, and 160 can be repeated as necessary. After a first instance of operation 160 sufficiently increased gap width $W_g$, more inorganic dielectric material is deposited in a second instance of operation 120, and the inorganic dielectric material thickness T is increased. Portions of inorganic dielectric material on the sidewalls of, and between, the IC dies are modified by laser exposure in a second instance of operation 150. In some embodiments, inorganic dielectric material at a level higher than the tops of the IC dies is modified by laser exposure. Modified portions of inorganic dielectric material on the sidewalls of, and between, the IC dies are removed in a second instance of operation 160. In some embodiments, modified portions of inorganic dielectric material at a level higher than the tops of the IC dies are removed.

Figure 4D:
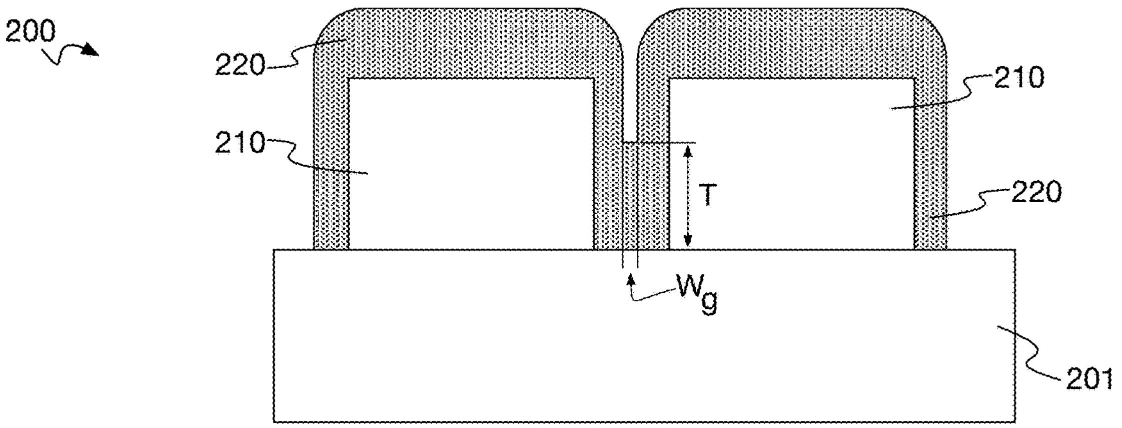
Figure 4E:
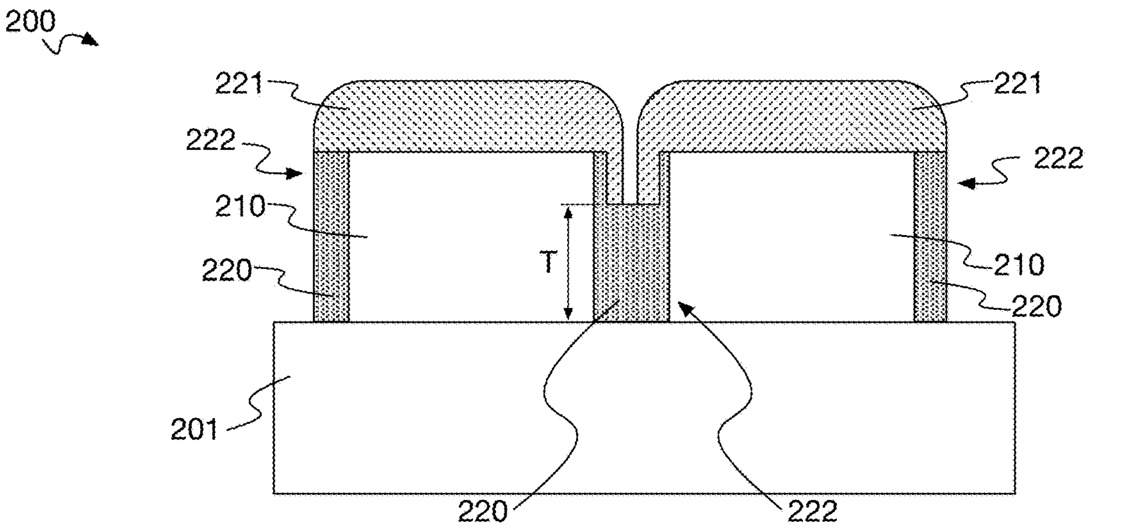
Figure 4F:
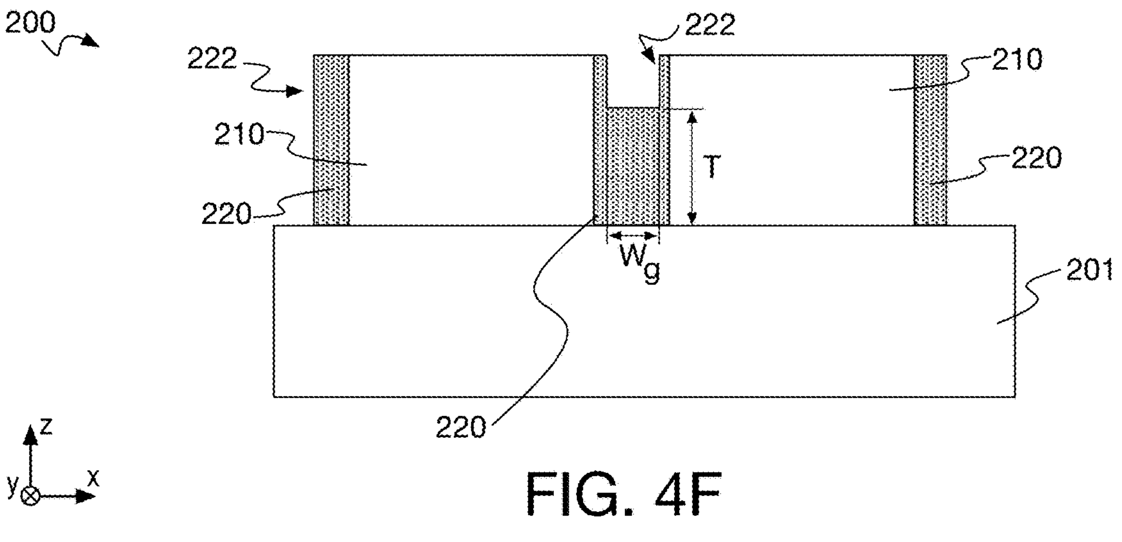

FIGS. 4D-4F show a progression of structures where additional inorganic dielectric material 220 is deposited, and the surface topography of inorganic dielectric material 220 between IC dies 210 is further reduced. FIG. 4D shows IC device 200 with inorganic dielectric material 220 over IC dies 210 and substrate 201. inorganic dielectric material 220 is substantially conformal over the tops and sidewalls of IC dies 210, including between IC dies 210 with a thickness T greater than the thickness T in FIG. 4C. Gap width $W_g$ is not great enough to allow further deposition of inorganic dielectric material 220 between IC dies 210.

FIG. 4E shows IC device 200 with inorganic dielectric material 220 over and between IC dies 210 and substrate 201. Modified inorganic dielectric material 221 is over IC dies 210 and between IC dies 210. Unmodified portions 222 of inorganic dielectric material 220 remain on the sidewalls of IC dies 210. Notably, a horizontal, unmodified portion 222 of inorganic dielectric material 220 remains over substrate 201 between IC dies 210 with an undiminished thickness T.

FIG. 4F shows IC device 200 with inorganic dielectric material 220 over and between IC dies 210 and substrate 201. Unmodified portions 222 of inorganic dielectric material 220 remain on the sidewalls of IC dies 210. Notably, a horizontal, unmodified portion 222 of inorganic dielectric material 220 remains over substrate 201 between IC dies 210 with an undiminished thickness T and a greater gap width $W_g$ between IC dies 210.

Returning to FIG. 1, operations 120, 150, and 160 can be repeated again. After a second instance of operation 160 sufficiently increased gap width $W_g$, more inorganic dielectric material is deposited in a third instance of operation 120, and the inorganic dielectric material thickness T is increased. Portions of inorganic dielectric material on the sidewalls of, and between, the IC dies are modified by laser exposure in a third instance of operation 150. In some embodiments, inorganic dielectric material at a level higher than the tops of the IC dies is modified by laser exposure. Modified portions of inorganic dielectric material on the sidewalls of, and between, the IC dies are removed in a third instance of operation 160. In some embodiments, modified portions of inorganic dielectric material at a level higher than the tops of the IC dies are removed.

Figure 4G:
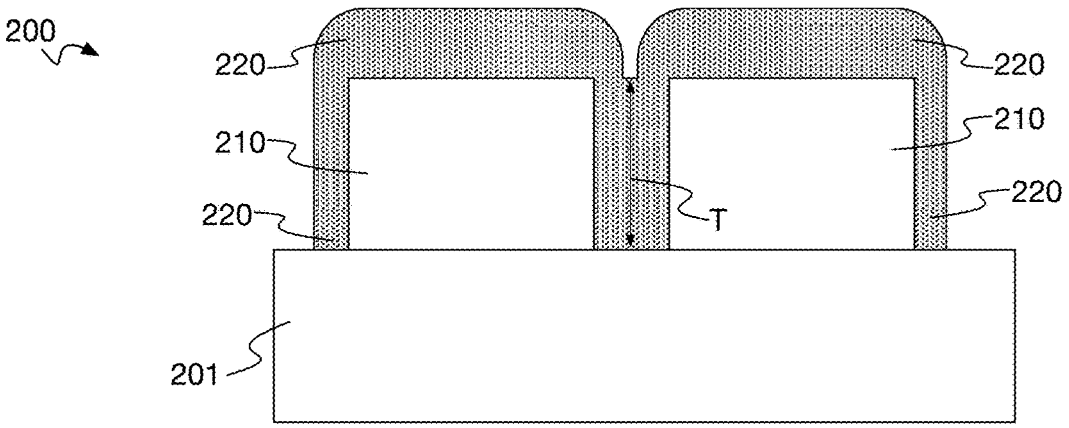
Figure 4H:
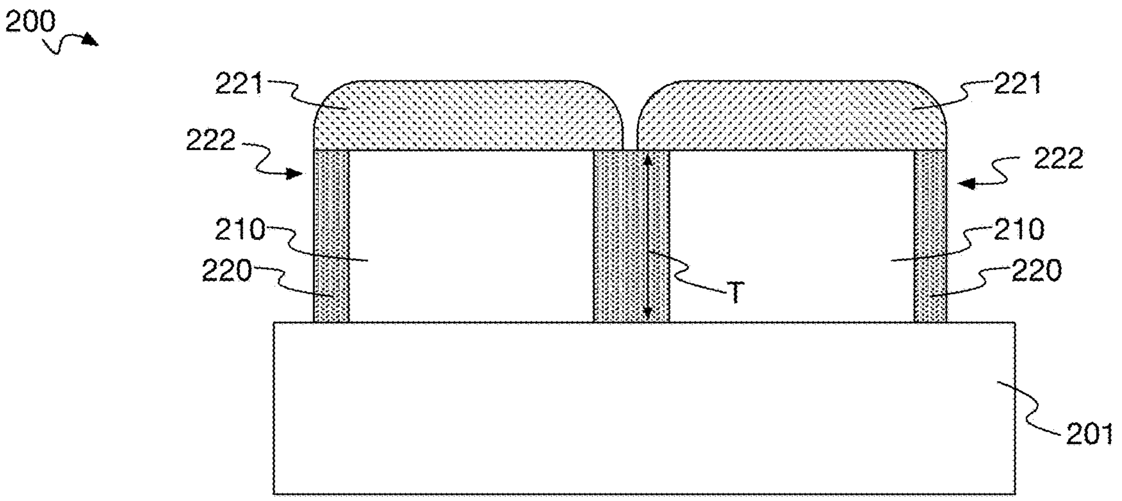
Figure 4I:
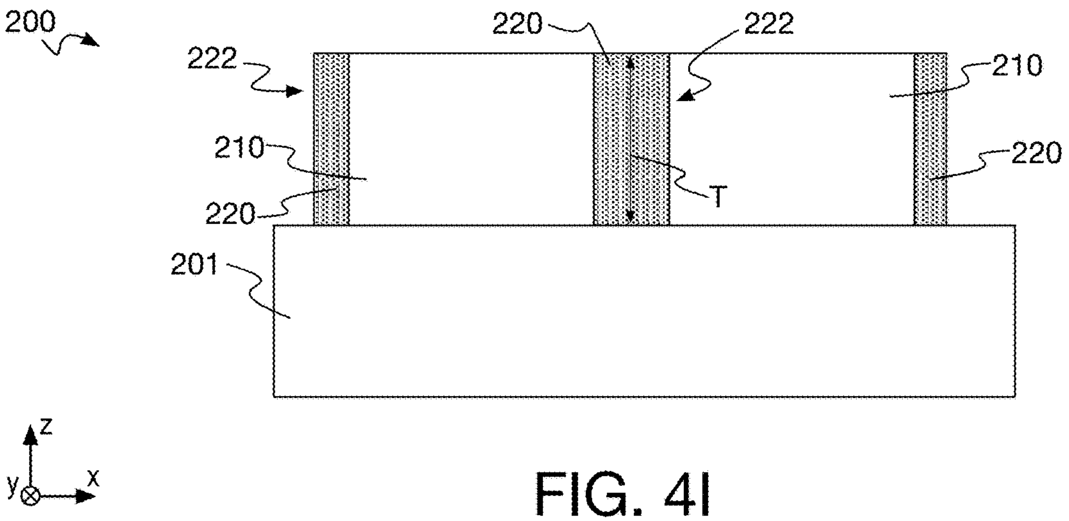

FIGS. 4G-4I show a progression of structures where additional inorganic dielectric material 220 is deposited, and the surface topography of inorganic dielectric material 220 between IC dies 210 is further reduced such that inorganic dielectric material 220 is substantially planarized with the upper surfaces of IC dies 210. FIG. 4G shows IC device 200 with inorganic dielectric material 220 over IC dies 210 and substrate 201. inorganic dielectric material 220 is substantially conformal over the tops of IC dies 210. inorganic dielectric material 220 is continuous between IC dies 210 from substrate 201 up to a thickness T level with the tops of IC dies 210. There is no gap in inorganic dielectric material 220 between IC dies 210.

FIG. 4H shows IC device 200 with inorganic dielectric material 220 over and between IC dies 210 and substrate 201. Modified inorganic dielectric material 221 is over IC dies 210. There is no modified inorganic dielectric material 221 between IC dies 210. Notably, an unmodified portion 222 of inorganic dielectric material 220 is continuous between IC dies 210 from substrate 201 up to thickness T level with the tops of IC dies 210.

FIG. 4I shows IC device 200 with inorganic dielectric material 220 between IC dies 210 and substrate 201. Notably, an unmodified portion 222 of inorganic dielectric material 220 remains between IC dies 210 with an undiminished thickness T. The surface topography of inorganic dielectric material 220 between IC dies 210 has been reduced such that inorganic dielectric material 220 is retained between IC dies 210 and substantially planarized with the upper surfaces of IC dies 210.

Methods 100 of FIG. 1 can also be practiced to form features, such as via holes, through portions of inorganic dielectric material. Operations 120, 150, and 160 can also be performed to form features of various sizes, concurrently with a single dielectric material removal operation.

FIGS. 5A, 5B, 5C, 5D, 5E, and 5F illustrate cross-sectional profile views of an IC device 200, including inorganic dielectric material 220, at various stages of manufacture, in accordance with some embodiments. FIGS. 5A-5F include a progression of structures showing inorganic dielectric material 220 deposited, modified, and removed where the modifying and removing forms a via opening within inorganic dielectric material 220. Examples are included of alternate surface features.

Returning to FIG. 1, inorganic dielectric material is deposited over, or adjacent to, an IC die in operation 120. Inorganic dielectric materials can be deposited as previously described. Multiple iterations of the deposition may be performed to produce an inorganic dielectric material structure of, e.g., the desired thickness.

Figure 5A:
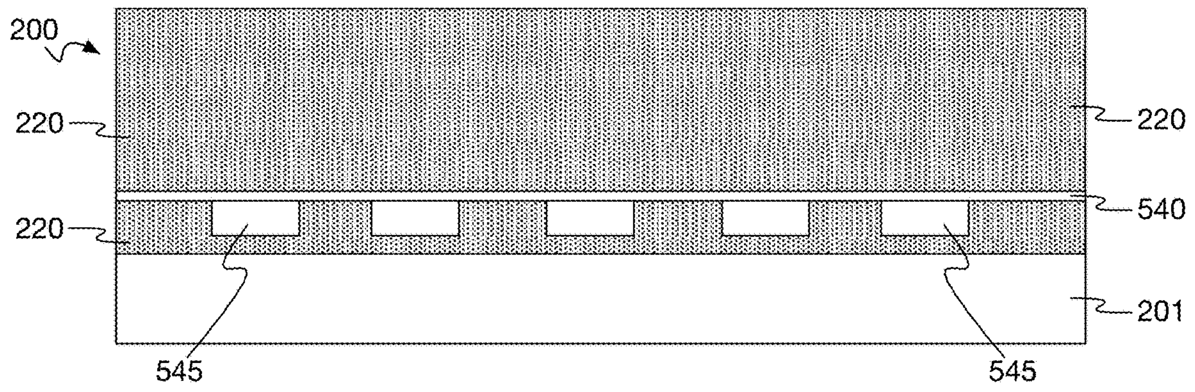
FIGS. 5A, 5B, 5C, 5D, 5E, and 5F illustrate cross-sectional profile views of an IC device, including inorganic dielectric material, at various stages of manufacture, in accordance with some embodiments.

FIG. 5A shows IC device 200 with inorganic dielectric material 220 over substrate 201 and over, or adjacent to, an IC die (not shown). Inorganic dielectric material 220 is also over an etch-stop layer 540, which is over multiple metallization features 545. In some embodiments, an IC die (from the perspective of FIG. 5A) is just behind metallization features 545, in the positive y direction from the viewing plane.

Returning to FIG. 1, a portion of the inorganic dielectric material is modified with laser exposure in operation 150. As previously described, laser characteristics may be adjusted to modify the desired portion(s) of inorganic dielectric material. The laser may be controlled to a first state for longer rectangular vias and to a second state for small, substantially cylindrical vias. In some embodiments, diffraction techniques are used to form vias of a diameter smaller than the laser spot size. In some embodiments, an anti-reflective coating is used over metallization features 545 to minimize reflected laser energy.

Figure 5B:
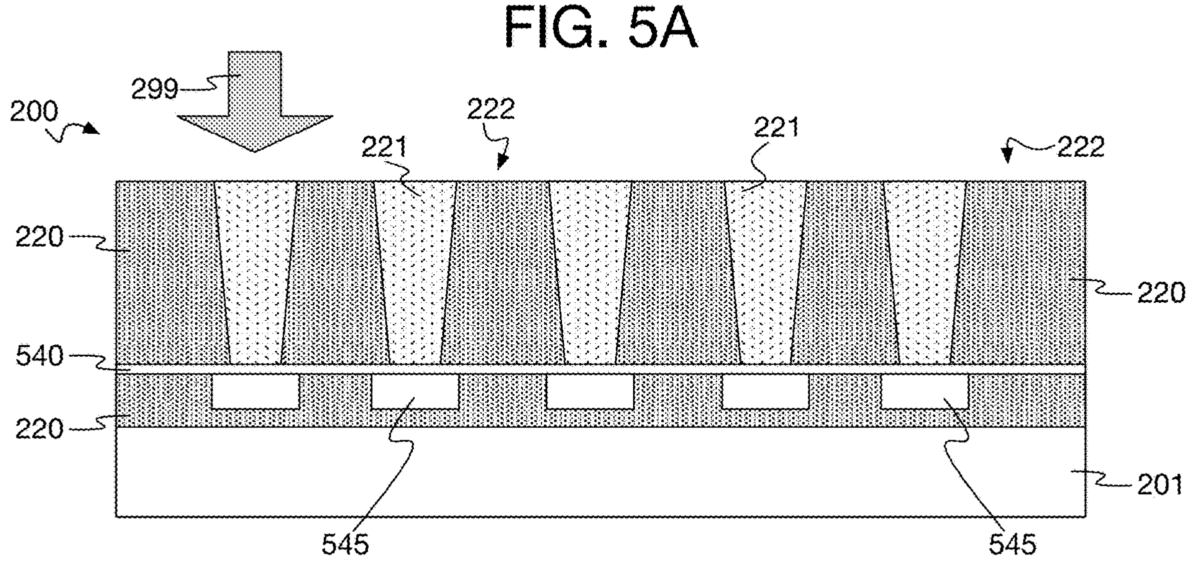

In FIG. 5B, IC device 200 is shown with modified portions of inorganic dielectric material 220, e.g., that have been exposed to laser energy 299. Portions of modified inorganic dielectric material 221 are over metallization features 545. Unmodified portions 222 of inorganic dielectric material 220 are adjacent and between modified inorganic dielectric material 221. In some embodiments, etch-stop layer 540 includes an anti-reflective material. In some such embodiments, the anti-reflective material includes nitrogen, e.g., silicon nitride. Any suitable thickness may be used. In some embodiments, the anti-reflective layer has a thickness of 70 nm.

Figure 5C:
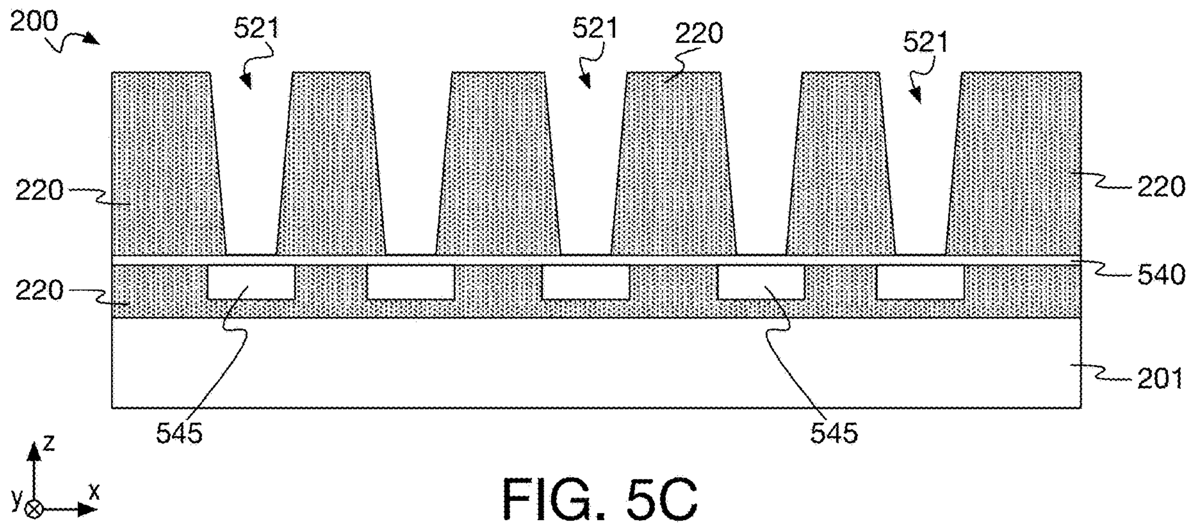

In FIG. 5C, IC device 200 is shown with via holes 521, e.g., voids in inorganic dielectric material 220, over metallization features 545 and without modified inorganic dielectric material 221. Unmodified portions of inorganic dielectric material 220 are adjacent and between via holes 521.

Figure 5D:
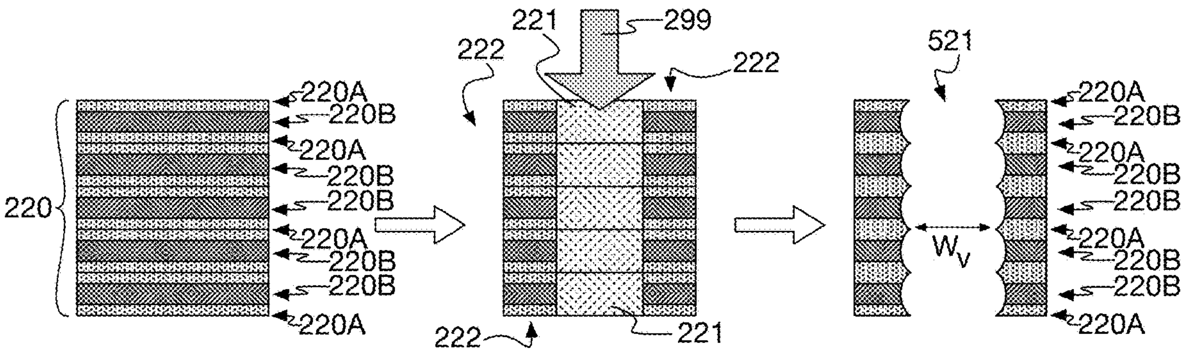

FIG. 5D illustrates a process of forming via holes through inorganic dielectric material 220. First, on the left, inorganic dielectric material 220 is formed. Although thick layers, e.g., with thicknesses of 30 μm or more, of substantially homogenous inorganic dielectric material can be conformally deposited (e.g., in an operation 120), in some embodiments, thinner layers (e.g., 5 μm thick) are deposited. In some such embodiments, inorganic dielectric material 220 includes bilayers of alternating materials. The term "bilayer" refers to a repeating unit of two material layers, one over the other. In some embodiments, inorganic dielectric material 220 includes bilayers comprising two materials with alternating or complementary stress states (e.g., tensile or compressive stress states). As shown in FIG. 5D, inorganic dielectric material 220 includes bilayers of inorganic dielectric material 220A, 220B. In some embodiments, inorganic dielectric material 220A is a first material, and inorganic dielectric material 220B is a second material. In some embodiments, inorganic dielectric materials 220A, 220B have a same composition but with different stress states. In some embodiments, inorganic dielectric materials 220A, 220B are the same material. In some embodiments, inorganic dielectric material 220 includes stress-tuned, multi-layer stacks, e.g., in 5 μm layers, with composition changes in increments of about 1 μm. The various examples of inorganic dielectric material 220 described here in FIG. 5D can be used in other embodiments of the current disclosure.

As further shown in FIG. 5D, exposure by laser energy 299 may include multiple incremental exposures, e.g., with different focus depths, particularly any portion having a large thickness.

This incremental exposure and subsequent removal can result in feature profile scalloping as shown in FIG. 5D. The terms "scalloping" and "scalloped" refer to the shapes of the concave regions of the feature depth profiles having larger via widths $W_v$ between ridges of smaller via widths $W_v$. Feature profile scalloping can occur for inorganic dielectric material 220 of a substantially homogenous composition purely as a result of repeated laser exposure, including at and to different depths, through a same lateral location, where the concave regions correspond to different focus depths. For example, laser exposure may be at depth intervals of 5 μm, and the concave regions of a scalloped depth profile may be at depth intervals of 5 μm corresponding to the laser exposure depths.

Such scalloping may be formed in any cavities hollowed out by laser exposure and wet etch, regardless of their shape. For example, horizontal trenches (and eventually the conductive structures formed in trenches) may show a scalloped depth profile as well as width variations along a lateral direction. A trench may be formed with regions of wider line width between ridges of narrower line width along a length of the trench.

In some embodiments, inorganic dielectric material 220 includes a group of bilayers, and a via through a portion of inorganic dielectric material 220 has a scalloped depth profile where the larger via widths $W_v$ are within a thickness of a first of the bilayers (e.g., inorganic dielectric material 220B) and the smaller via widths $W_v$ are within a thickness of a second of the bilayers (e.g., inorganic dielectric material 220A). In some embodiments, a via extends through a portion of inorganic dielectric material 220 with bilayers, and the via does not have a scalloped depth profile.

Figure 5E:
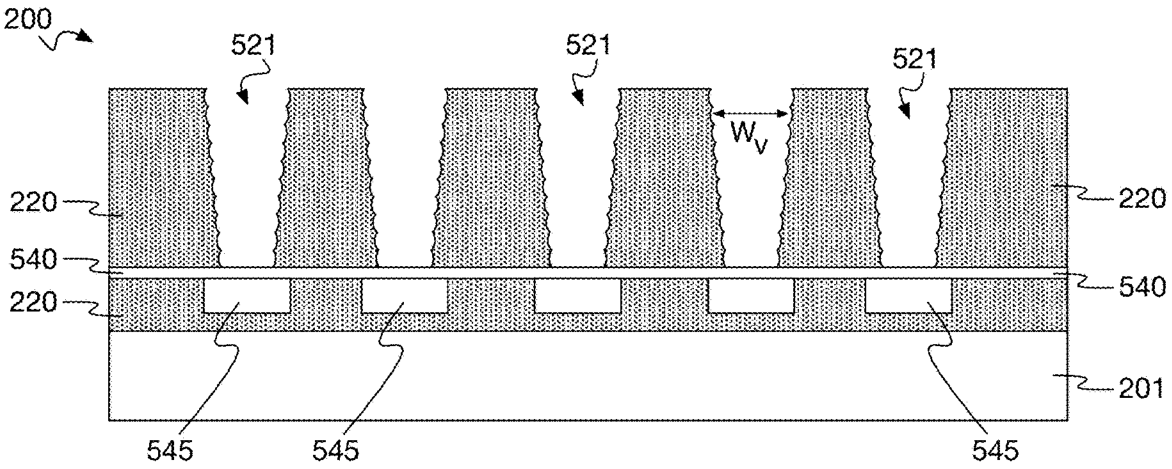

FIG. 5E shows IC device 200 with multiple via holes 521 extending through a portion of inorganic dielectric material 220. Via holes 521 are similar to via holes 521 in FIG. 5C, but via holes 521 in FIG. 5E have scalloped depth profiles.

Figure 5F:
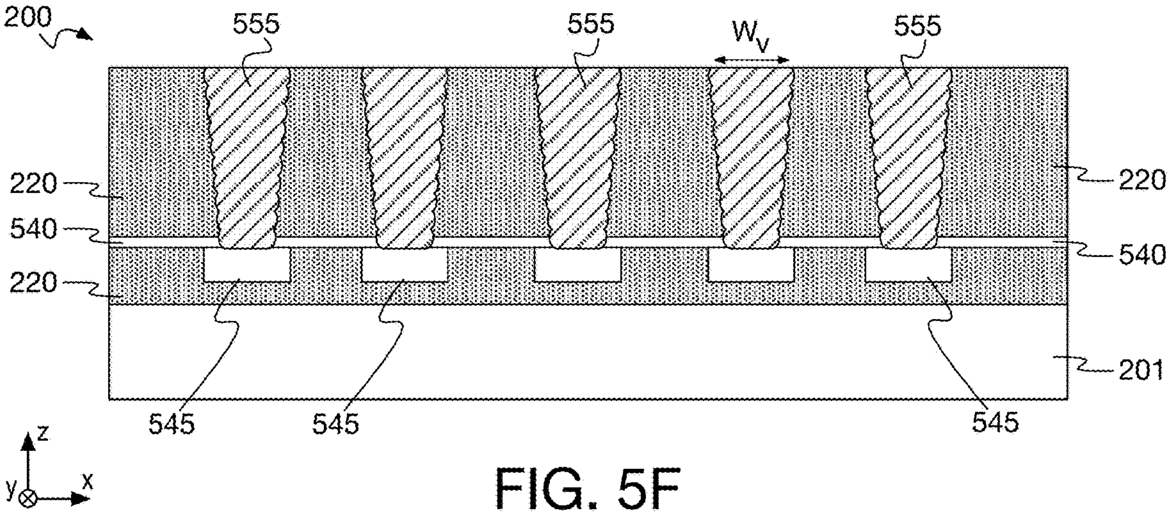

FIG. 5F shows IC device 200 with multiple conductive vias 555 extending through a portion of inorganic dielectric material 220. Conductive vias 555 occupy via holes 521 in FIG. 5E, but contact metallization features 545.

In some embodiments, a via width $W_v$ is about 10 μm. Diffraction techniques may be used to reduce the lateral area of the laser exposure. In some embodiments, a via width $W_v$ is 2 μm. In some embodiments, a via width $W_v$ is 400 nm.

As noted above, methods 100 of FIG. 1 can be practiced to form via holes, trenches, and other features of vastly different sizes, concurrently with a single material removal operation and/or without the use of an etch-stop layer. The targeted laser exposure provides selectivity of the removal of inorganic dielectric material independent of, feature size. Etch depths can be controlled without etch-stop layers by adjusting laser exposure depths of focus to modify specifically targeted inorganic dielectric material. Features of various shapes and sizes can be formed with programmed laser exposure and a single, concurrent removal by a wet etch. For example, material may be modified for shallow and deep vias concurrently. Likewise, material for and wide and narrow trenches can be modified concurrently. A single wet etch operation may then remove all modified material to render the features of different dimension. Optional operations 170 and 180 can then form conductive structures in the voids formed in inorganic dielectric material.

FIGS. 6A, 6B, 6C, 6D, and 6E illustrate a progression of structures showing composite IC device 600 with inorganic dielectric material 220 deposited, modified, and removed where the modifying and removing (and subsequent metallization) forms multiple conductive vias 555 of differing depth within inorganic dielectric material 220.

FIGS. 7A, 7B, 7C, 7D, and 7E illustrate a progression of structures showing composite IC device 600 with inorganic dielectric material 220 deposited, modified, and removed where the modifying and removing and subsequent metallization forms interconnected vias 555 and lines 765 within inorganic dielectric material 220.

Returning to FIG. 1, inorganic dielectric material is deposited over and adjacent to IC dies in operation 120. In some embodiments, an uneven surface topography is formed over one or more IC dies. In some embodiments, operations 120, 150, and 160 are performed iteratively to fill a space between IC dies with inorganic dielectric material.

Figure 6A:
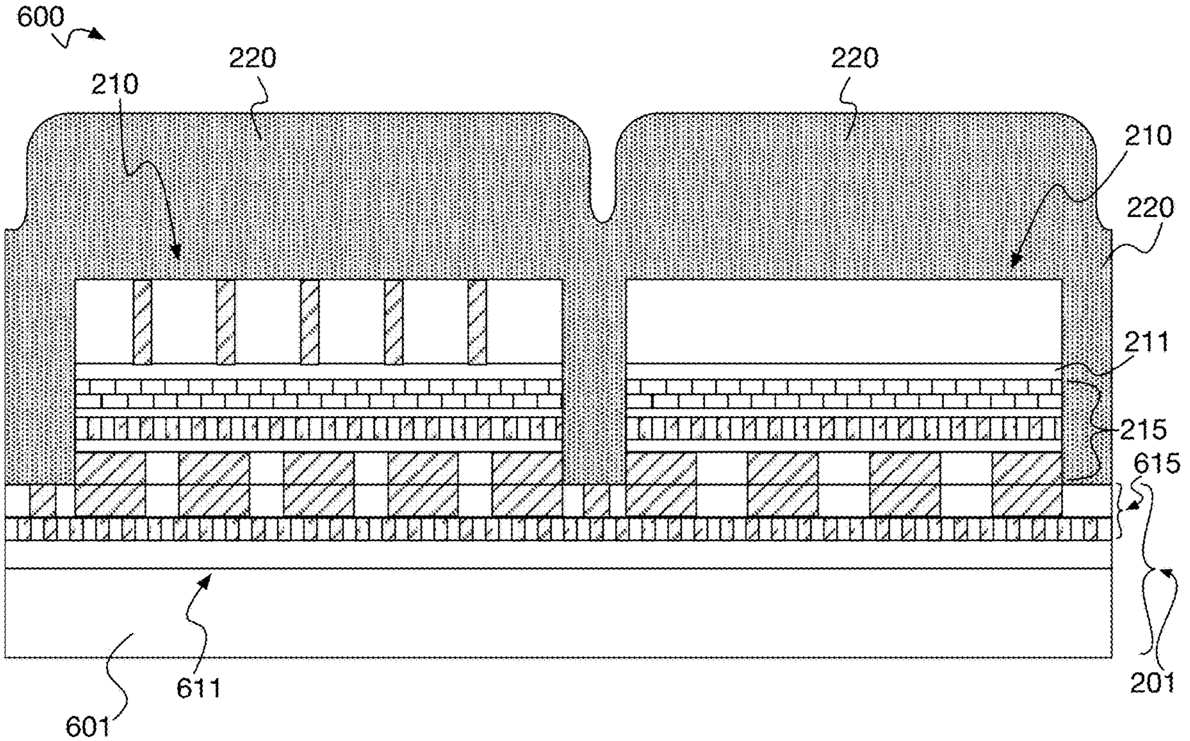
FIGS. 6A, 6B, 6C, 6D, and 6E illustrate cross-sectional profile views of a composite IC device, including IC dies, inorganic dielectric material, and via structures, at various stages of manufacture, in accordance with some embodiments.
Figure 7A:
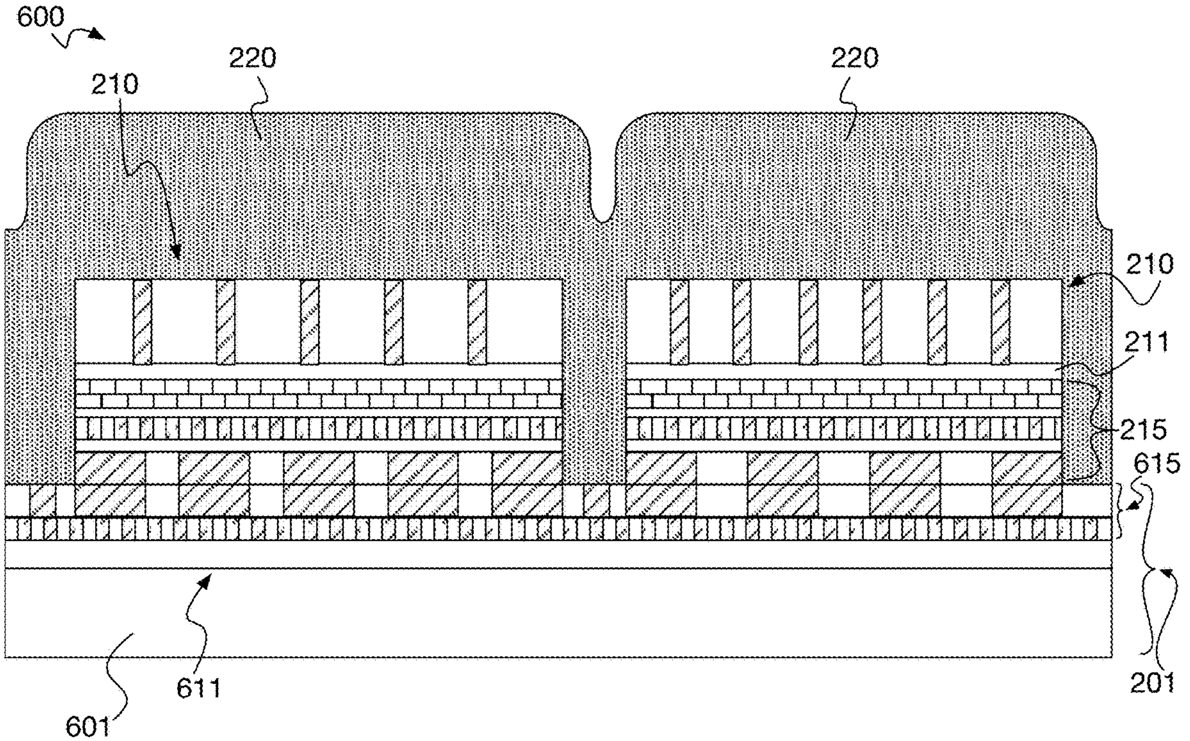
FIGS. 7A, 7B, 7C, 7D, and 7E illustrate cross-sectional profile views of composite IC device, including IC dies, inorganic dielectric material, conductive vias, and conductive lines, at various stages of manufacture, in accordance with some embodiments.

FIGS. 6A and 7A show composite IC device 600 with inorganic dielectric material 220 over and adjacent to IC dies 210 coupled to substrate 201. In some embodiments, IC dies 210 are hybrid bonded to substrate 201. IC dies 210 include metallization features 215. Substrate 201 includes metallization features 615 over a base layer 601, which may be a crystalline material. In some embodiments, one of metallization features 215 are direct bonded to one of metallization features 615. In some embodiments, base layer 601 is predominantly silicon. IC dies 210 may include a crystalline material, such as silicon or other semiconductor materials, such as a III-V material. IC dies 210 and substrate 201 may have active components. In some embodiments, IC die 210 has active devices, such as transistors, in an active device layer 211. In some embodiments, substrate 201 has active devices, such as transistors, in an active device layer 611.

Inorganic dielectric material 220 over IC dies 210 includes mesas with substantial surface topography. In some embodiments, inorganic dielectric material 220 has a substantially homogenous composition. Conventional removal techniques often employ etch-stop layers. For example, some etching processes form tall, narrow features, such as multi-level conductive vias, by iteratively etching one via over another. Notably, such etch-stop layers are absent in the inorganic dielectric material 220 of FIGS. 6A and 7A. In some embodiments, inorganic dielectric material 220 includes a group of bilayers. Although no etch-stop layer is needed, an anti-reflective material may be used over metallization features to reduce interference with laser exposure. In some embodiments, inorganic dielectric material 220 includes a first layer of predominantly silicon and nitrogen (e.g., silicon nitride) in contact with IC dies 210 and a second layer of predominantly silicon and oxygen (e.g., silicon dioxide) over the first layer.

Returning to FIG. 1, inorganic dielectric material is modified by laser exposure in operation 150. Inorganic dielectric material over and adjacent IC dies is modified. As previously described, desired areas of inorganic dielectric material and at various depths can be exposed to laser energy and modified. All modified inorganic dielectric material can be exposed from above without any iterative etching and exposing, e.g., without the need for an etch-stop layer interrupting the contiguous structure of the inorganic dielectric material.

Figure 6B:
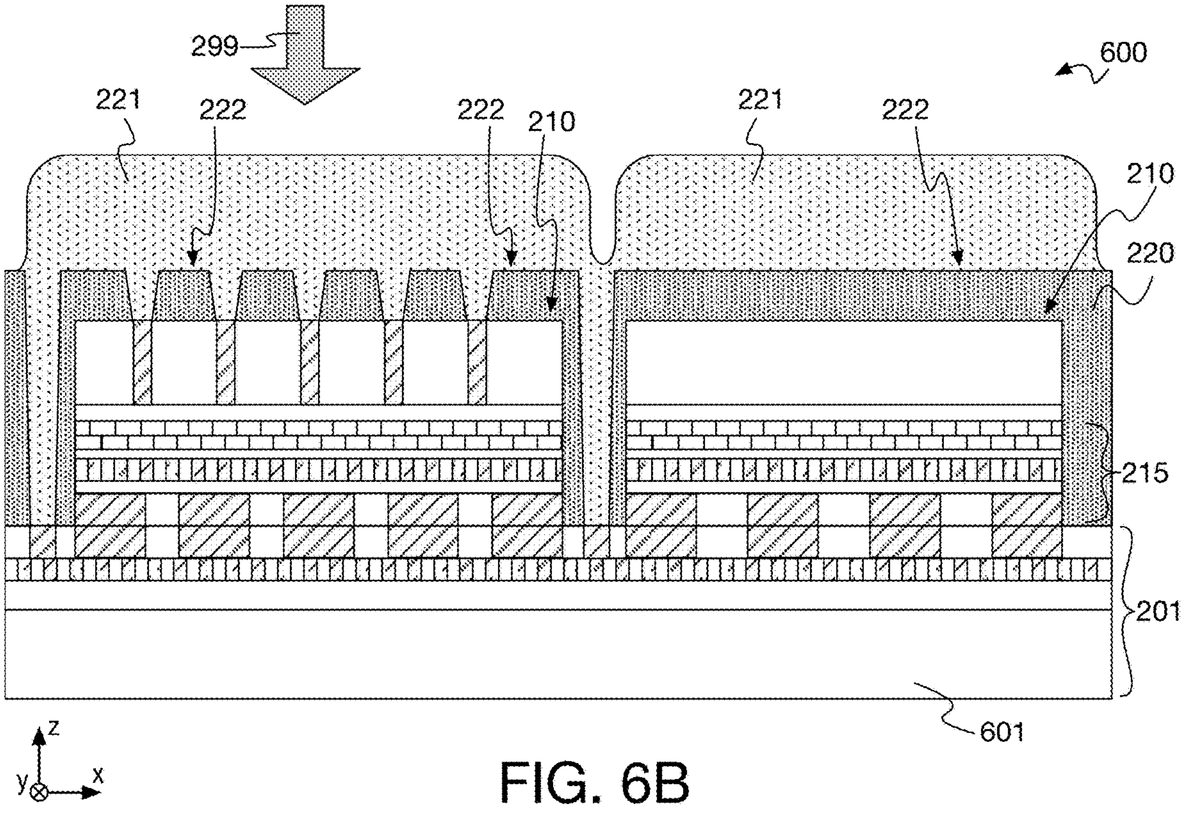
Figure 7B:
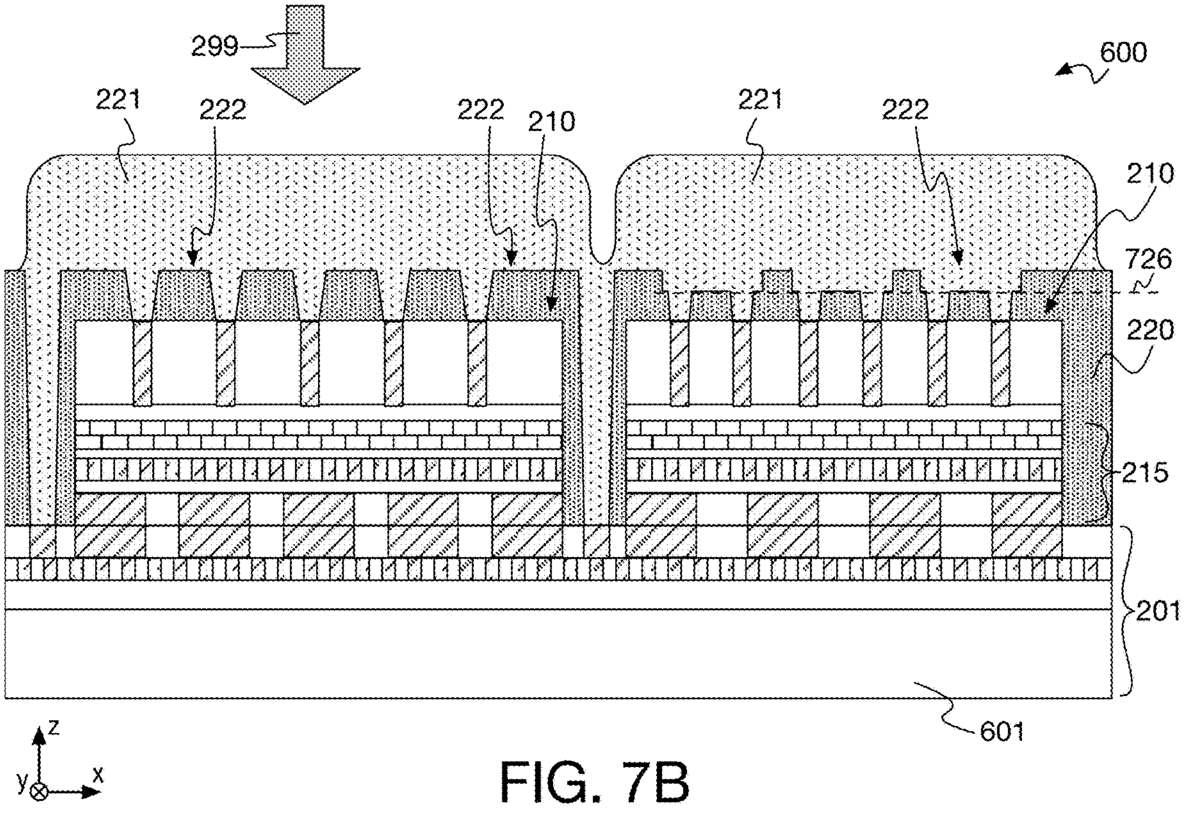

FIGS. 6B and 7B show composite IC device 600 with inorganic dielectric material 220 over and adjacent to IC dies 210 and modified inorganic dielectric material 221 extending vertically from upper surfaces of inorganic dielectric material 220 down to various depths. The tall mesas of inorganic dielectric material 220 over IC dies 210 are now modified inorganic dielectric material 221. Modified inorganic dielectric material 221 includes both short, high features over IC die 210 and tall, deep features extending from above IC dies 210 down to substrate 201. Short features over IC die 210 can be removed to form conductive vias between IC die 210 and structures over IC dies 210. The tall, deep features of modified inorganic dielectric material 221 extending between IC dies 210 can be removed to form tall conductive vias between substrate 201 and structures over IC dies 210. Such varied modifications can be made to inorganic dielectric material 220 without iterative removal operations. Unmodified portions 222 of inorganic dielectric material 220 are over and adjacent to both IC dies 210.

FIG. 7B also shows horizontal features connecting vertical features over IC die 210 below an elevated mesa of inorganic dielectric material 220. A dashed, horizontal line 726 indicates a level where an etch-stop layer would be employed in conventional removal processes. Such an etch-stop layer would be used to terminate an etch for excavating a trench over and connecting vias over IC die 210. In the embodiments of FIGS. 6B and 7B, no such etch-stop layer is necessary. In some embodiments, no compositionally distinct etch-stop layer is present at, above, or below line 726. In some such embodiments, no compositionally distinct etch-stop layer is present in all of inorganic dielectric material 220.

Returning to FIG. 1, modified inorganic dielectric material is selectively removed in operation 160, and unmodified inorganic dielectric material is kept. All modified inorganic dielectric material can be removed with a single wet etch, e.g., without the need for an etch-stop layer interrupting the contiguous structure of the inorganic dielectric material. Conventional methods would require etch-stop layers to etch via and line openings of varied depths and landings. For example, etch-stop layers would be needed at a bottom of a line trench where the line joins to a via. Etch-stop layers would generally be needed for very deep and narrow vias to iteratively etch deep via openings.

Figure 6C:
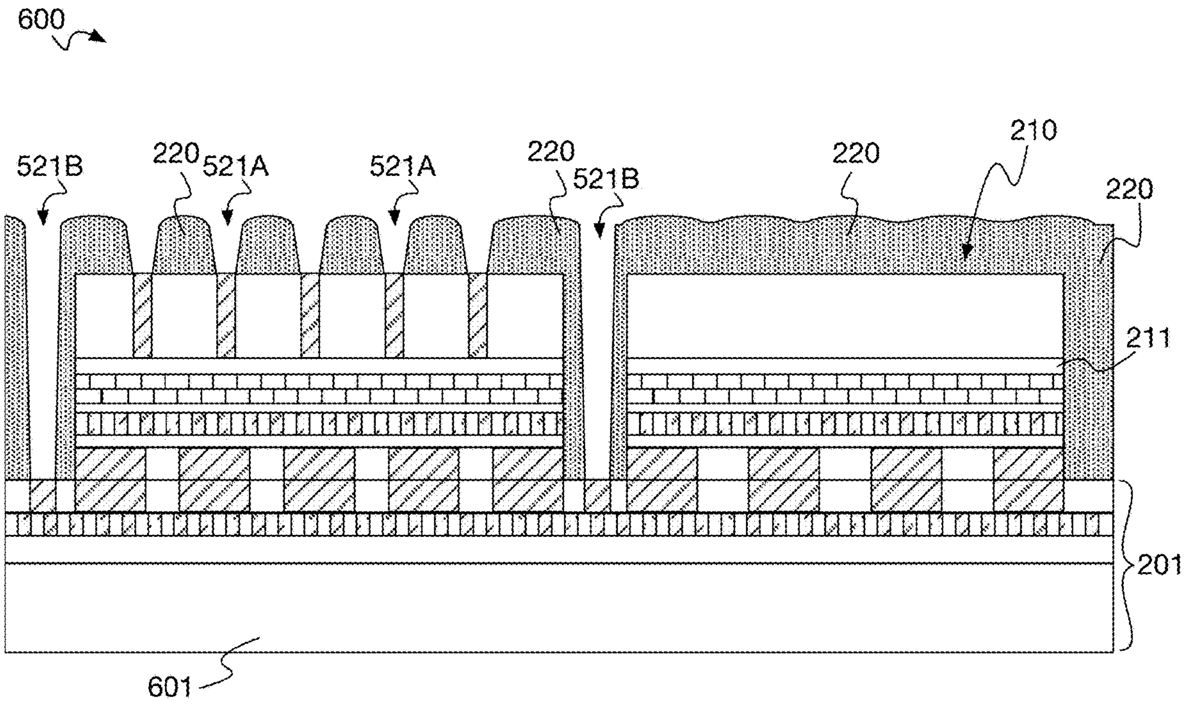
Figure 7C:
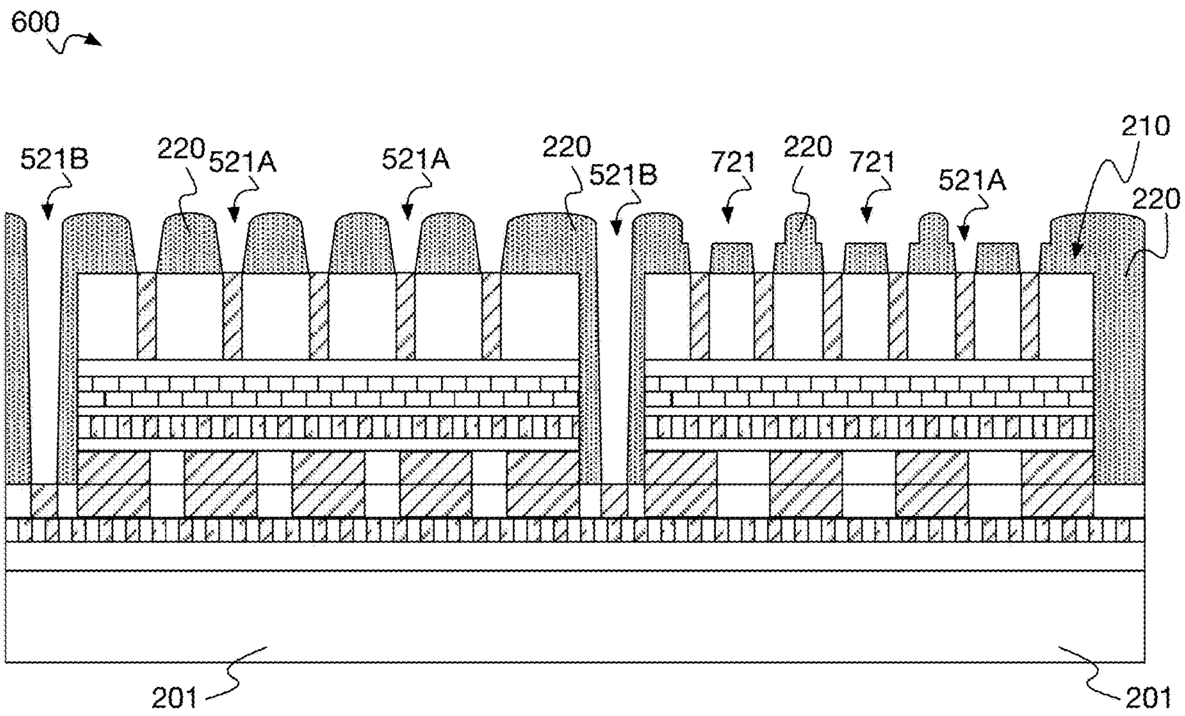

FIGS. 6C and 7C show composite IC device 600 with inorganic dielectric material 220 over and adjacent to IC dies 210 and no remaining modified inorganic dielectric material 221. Voids, e.g., via holes 521 or line trenches 721, remain in inorganic dielectric material 220 where modified inorganic dielectric material 221 was removed. Voids include high, short via holes 521A (and line trenches 721 connecting some via holes 521A in FIG. 7C) over IC die 210 and tall, deep via holes 521B extending from above IC dies 210 down to substrate 201. Inorganic dielectric material 220 includes surface topography over IC dies 210 where modified inorganic dielectric material 221 was removed. In some embodiments, surface topography is introduced by impact from laser exposure and subsequent removal of modified inorganic dielectric material 221.

In some embodiments, tall, deep via holes 521B are twice as deep as high, short via holes 521A over IC die 210. In some such embodiments, neither via holes 521A, 521B pass through a compositionally distinct etch-stop layer. In some embodiments, inorganic dielectric material 220 has a substantially homogenous composition at and around via holes 521A, 521B and line trenches 721. In some such embodiments, inorganic dielectric material 220 is of a substantially homogenous composition throughout composite IC device 600.

Returning to FIG. 1, conductive material is deposited into via openings or trenches in operation 170. The conductive material may include any suitable materials. In some embodiments, the conductive material includes copper or aluminum. The conductive material may be formed by any suitable means. For example, physical vapor deposition (PVD) or sputter may be used. In some embodiments, PVD is used to form a layer, e.g., a seed layer, of a metal. Electroplating may be used. In some embodiments, electroplating is use to form a metal, e.g., copper, over a seed layer of the metal. One or more barrier layers, e.g., a relatively thin layer of titanium or tantalum, may be used before depositing a bulk conductive material, e.g., copper.

Figure 6D:
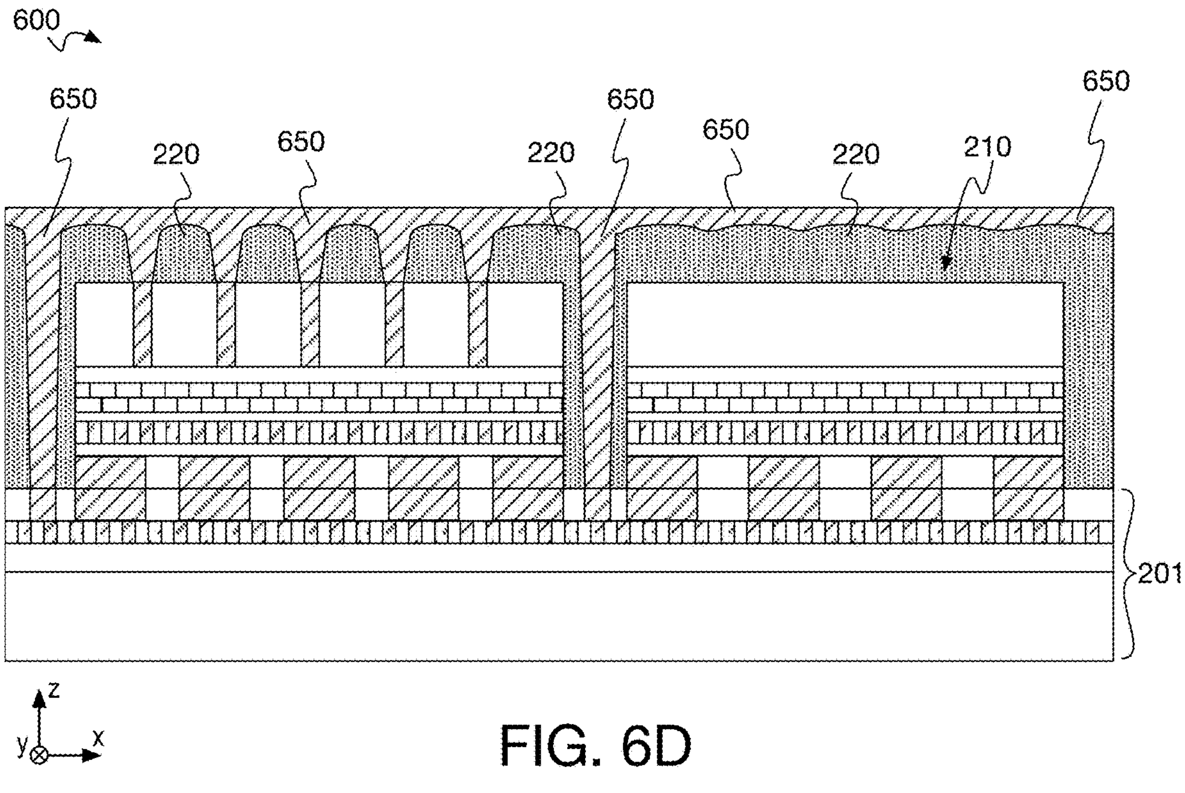

FIG. 6D shows composite IC device 600 with inorganic dielectric material 220 over and adjacent to IC dies 210 and conductive material 650 in via holes 521A, 521B. Conductive material 650 forms a single, contiguous structure in all of via holes 521A, 521B, short and tall, and over IC dies 210.

Figure 7D:
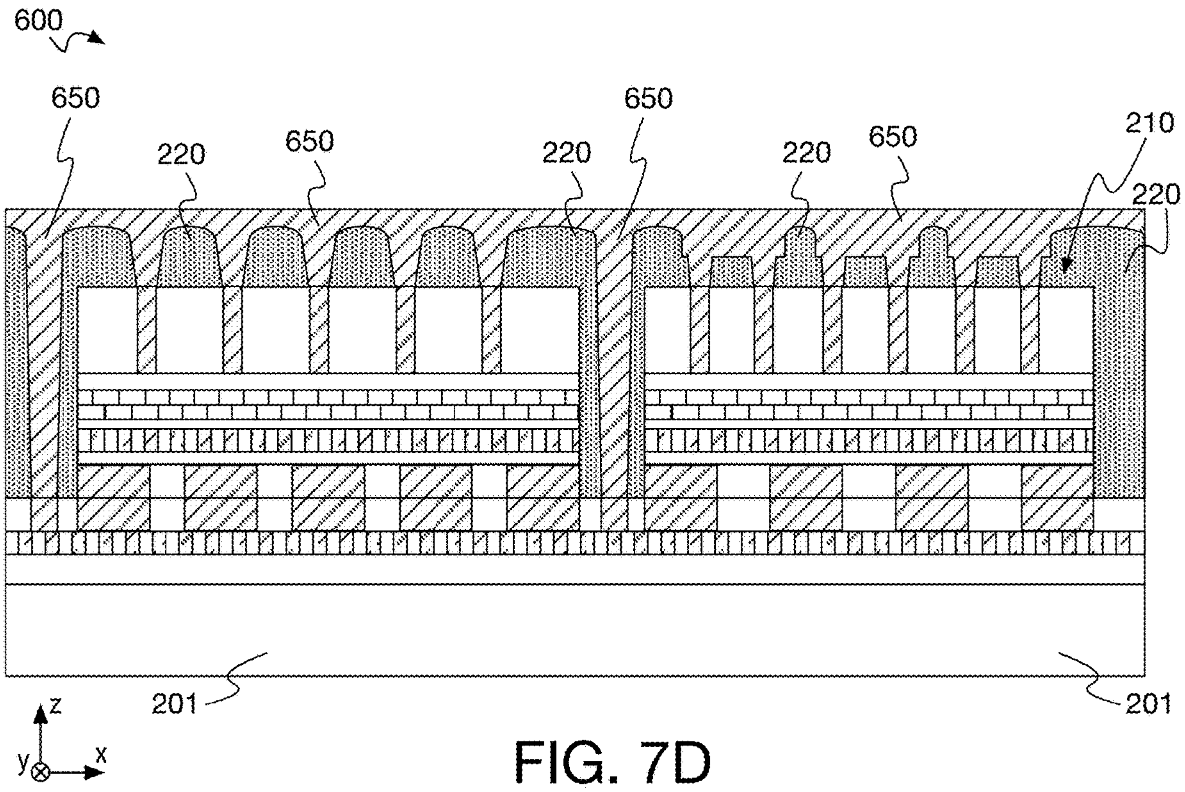

FIG. 7D shows composite IC device 600 with inorganic dielectric material 220 over and adjacent to IC dies 210 and conductive material 650 in via holes 521A, 521B, and line trenches 721. Conductive material 650 forms a single, contiguous structure in all of via holes 521A, 521B, and line trenches 721 and over IC dies 210.

Returning to FIG. 1, a surface of the conductive material is planarized with a surface of the unmodified portion of the inorganic dielectric material in operation 180. The conductive and inorganic dielectric materials can be planarized by any suitable means. Conventional methods may be used. In some embodiments, CMP is used to planarize the surface of the conductive material with the surface of the remaining inorganic dielectric material.

Figure 6E:
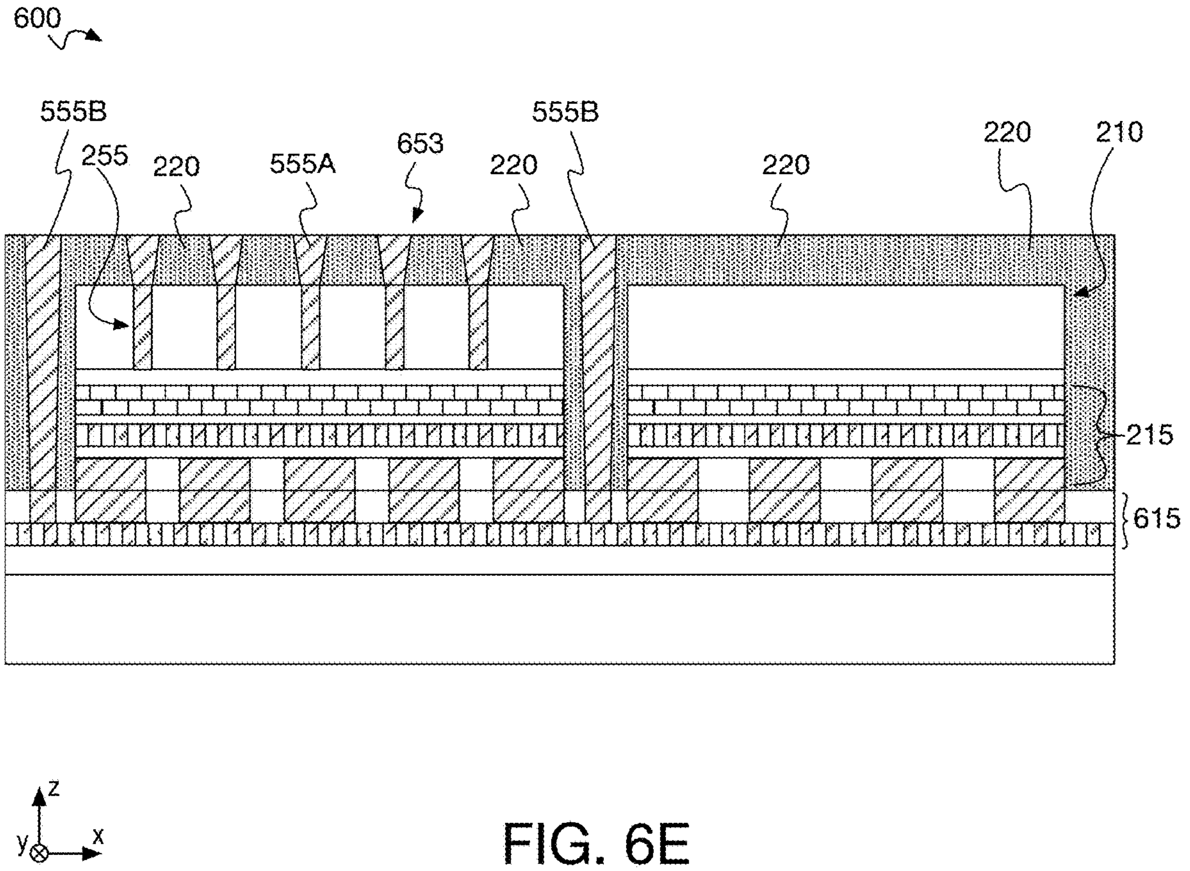

FIG. 6E shows composite IC device 600 with inorganic dielectric material 220 over and adjacent to IC dies 210 and conductive vias 555A, 555B over and adjacent to IC dies 210. Conductive vias 555A, 555B are substantially planarized at an upper surface 653 with the retained inorganic dielectric material 220. Conductive vias 555A over IC die 210 are electrically coupled to metallization features 215 of IC die 210 by through-silicon vias (TSVs) 255. Tall conductive vias 555B adjacent to IC dies 210 are electrically coupled to metallization features 615 adjacent to IC dies 210 on substrate 201. Depth profiles of conductive vias 555 may vary much as described in FIGS. 5D-5F. In some embodiments, a depth profile of conductive via 555 over IC die 210 and conductive via 555 adjacent IC die 210 (and over substrate 201) includes a region of a larger via width between ridges of a smaller via width. In some such embodiments, inorganic dielectric material 220 has a substantially homogenous composition at, and contiguously between, all conductive vias 555A, 555B. In further such embodiments, the depth of a tall conductive via 555B adjacent IC die 210 is at least twice the depth of a high, short conductive via 555A over IC die 210. In other embodiments, inorganic dielectric material 220 includes a group of bilayers, a depth profile of conductive via 555A over IC die 210 or conductive via 555B adjacent IC die 210 includes a region of a larger via width between ridges of a smaller via width, the larger via width is within a thickness of a first of the bilayers, and the smaller via widths are within a thickness of a second of the bilayers.

Figure 7E:
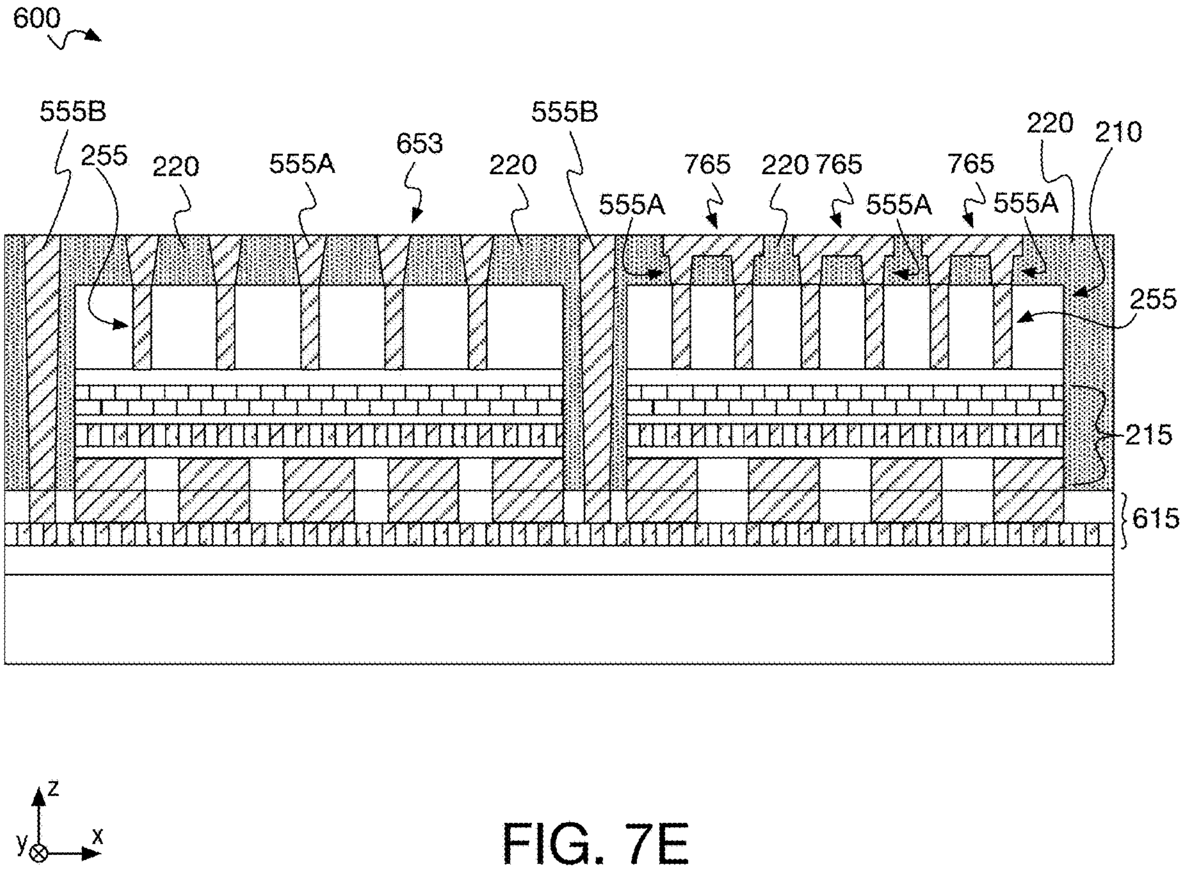

FIG. 7E shows composite IC device 600 with inorganic dielectric material 220 over and adjacent to IC dies 210 and conductive vias 555A, 555B and conductive lines 765 over and adjacent to IC dies 210. Conductive vias 555A, 555B and conductive lines 765 are substantially planarized at an upper surface 653 with the retained inorganic dielectric material 220. Inorganic dielectric material 220 is contiguous throughout composite IC device 600, uninterrupted by an etch-stop layer. Conductive vias 555A are in contact with conductive lines 765, and both features are surrounded by a compositionally homogenous region of the inorganic dielectric material. Conductive vias 555A over both IC dies 210 are electrically coupled to metallization features 215 of respective IC die 210 by TSVs 255. Tall conductive vias 555B adjacent to IC dies 210 are electrically coupled to metallization features 615 adjacent to IC dies 210 on substrate 201. Depth profiles of conductive vias 555A, 555B may vary much as described in FIGS. 5D-5F. In some embodiments, a depth profile of conductive via 555A over IC die 210 and conductive via 555B adjacent IC die 210 (and over substrate 201) includes a region of a larger via width between ridges of a smaller via width. In some such embodiments, inorganic dielectric material 220 has a substantially homogenous composition at, and contiguously between, all conductive vias 555A, 555B. In further such embodiments, the depth of conductive via 555B adjacent IC die 210 is at least twice the depth of conductive via 555A over IC die 210. In some embodiments, no conductive vias 555A, 555B pass through an etch-stop layer with a composition distinct from inorganic dielectric material 220. In some embodiments, a length of the conductive line 765 includes regions of wider line width between ridges of narrower line width.

Methods 100 of FIG. 1 can be used to improve device singulation. As previously described, conventional methods cannot conveniently or efficiently process large thicknesses of inorganic dielectric material. Composite IC devices may have inorganic dielectric material deposited in multiple layers alongside stacks of multiple IC dies. Dielectric material thicknesses can approach 100 μm. Mechanical saws and laser scribes used for singulating substrates, e.g., silicon wafers, do not also separate devices at a dielectric level. Singulation solutions generally include different equipment or techniques for, e.g., cutting through a substrate and the dielectric materials formed on the substrate. As previously described, mechanical solutions are problematic, and conventional wet or dry etches are time or cost prohibitive. The modification and removal operations of methods 100 are easily adapted to the application of singulating composite IC devices.

Figure 8A:
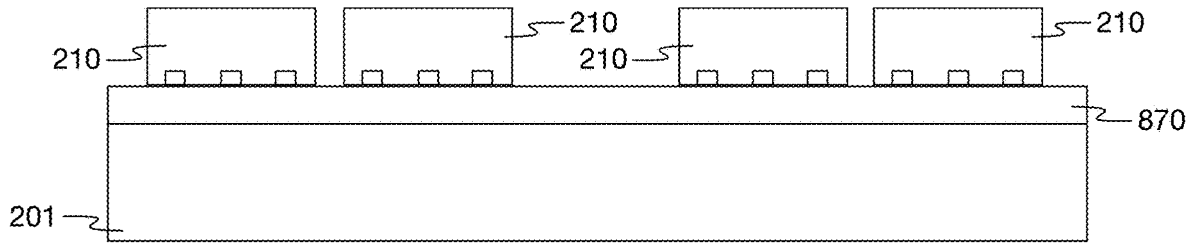
FIGS. 8A, 8B, 8C, 8D, 8E, 8F, 8G, 8H, and 8I illustrate cross-sectional profile views of composite IC device, including IC dies and inorganic dielectric material, at various stages of manufacture, in accordance with some embodiments.

FIGS. 8A, 8B, 8C, 8D, 8E, 8F, 8G, 8H, and 8I illustrate cross-sectional profile views of composite IC device 600, including IC dies 210, 810 and inorganic dielectric material 220, at various stages of manufacture, in accordance with some embodiments. FIGS. 8A-8I include a progression of structures showing inorganic dielectric material 220 deposited, modified, and removed where the modifying and removing clears out a deep trench in inorganic dielectric material 220 around one or more IC dies 210. FIG. 8A shows multiple IC dies 210 coupled to substrate 201 at an adhesive layer 870. Substrate 201 may be a carrier or handle die.

Figure 8B:
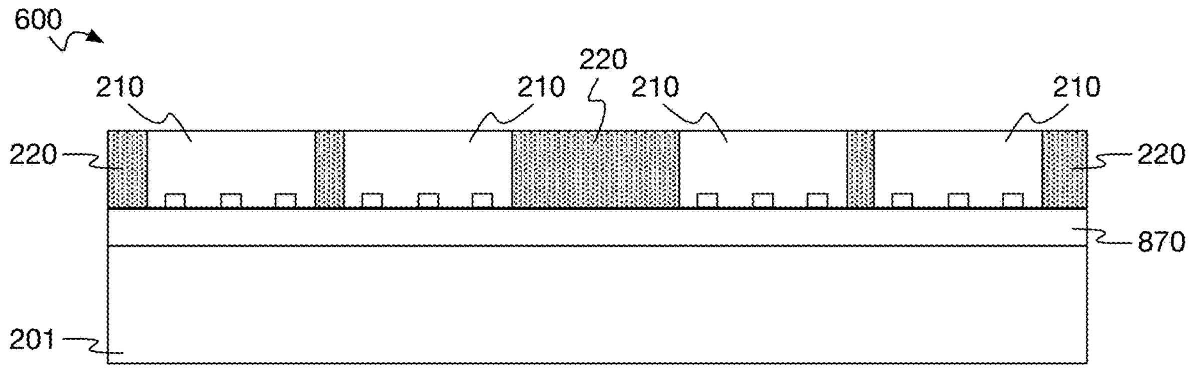
Figure 8C:
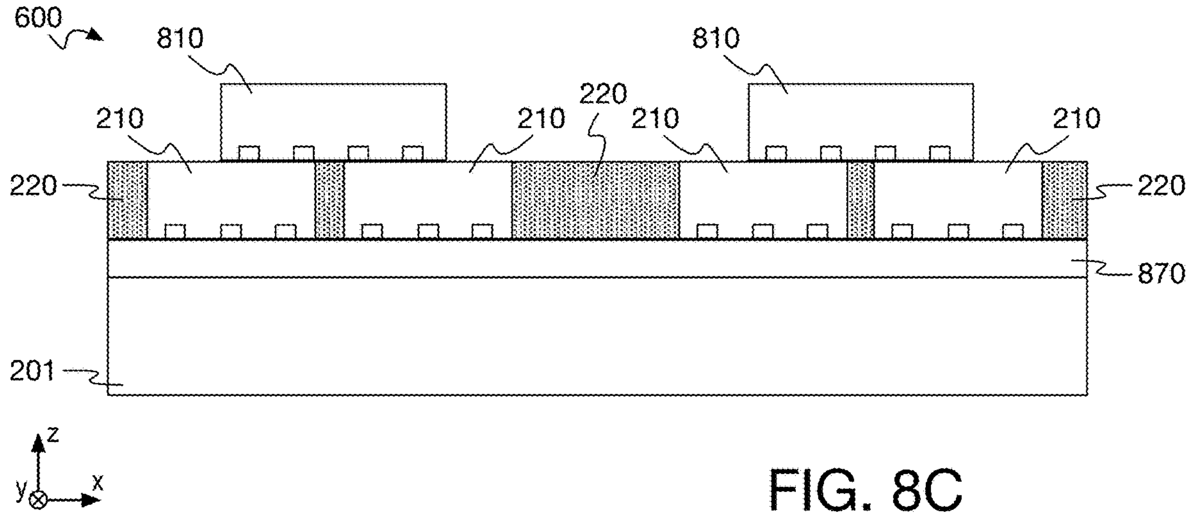

Returning to FIG. 1, inorganic dielectric material is deposited over, and adjacent to, IC dies in operation 120. Inorganic dielectric material may be deposited as previously described. As necessary, inorganic dielectric material may be modified and removed using operations 150 and 160, or other methods may be used, e.g., CMP, to planarize an upper surface of the composite IC device. FIG. 8B shows composite IC device 600 with inorganic dielectric material 220 adjacent, including between, multiple IC dies 210. FIG. 8C shows composite IC device 600 with multiple second-level IC dies 810 coupled to inorganic dielectric material 220 and multiple IC dies 210.

Returning to FIG. 1, inorganic dielectric material is again deposited over, and adjacent to, IC dies in operation 120, as previously described. Inorganic dielectric material may be planarized to an upper surface of the composite IC device.

Figure 8D:
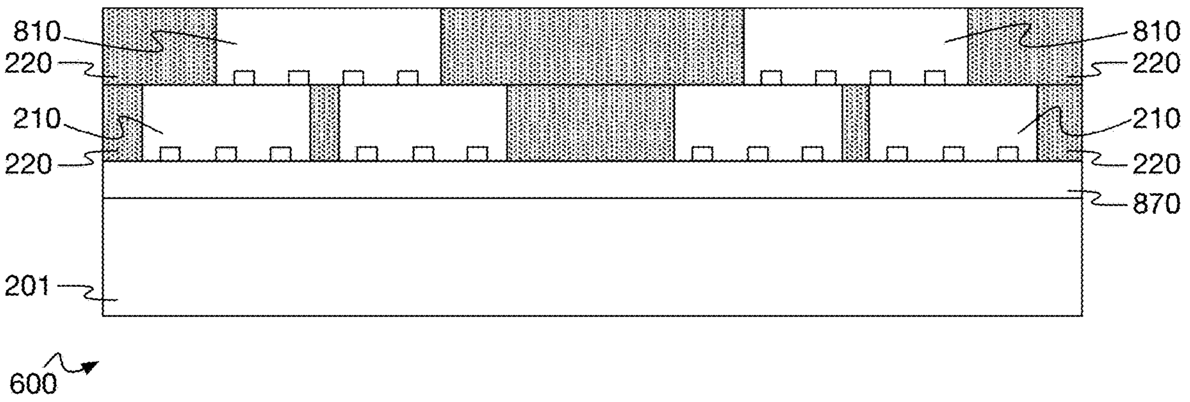
Figure 8E:
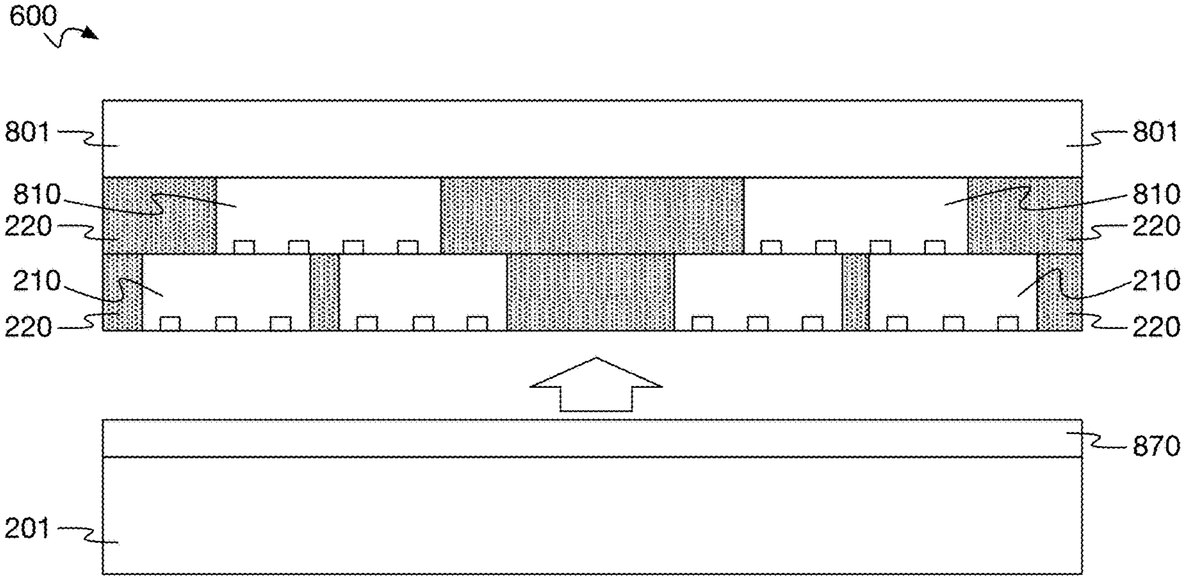
Figure 8F:
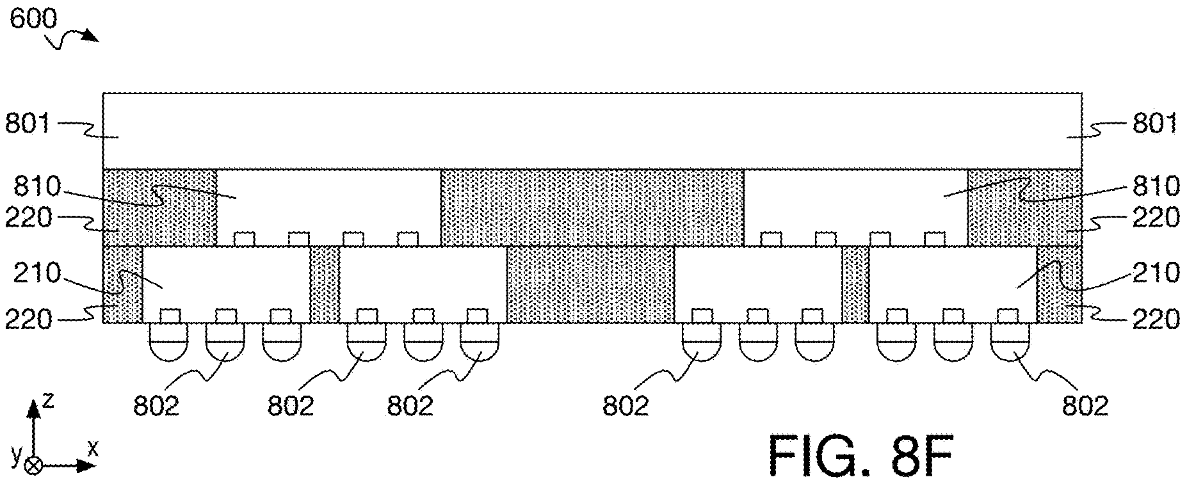

FIG. 8D shows composite IC device 600 with inorganic dielectric material 220 adjacent, including between, multiple IC dies 210, 810. FIG. 8E shows composite IC device 600 with inorganic dielectric material 220 and multiple IC dies 210, 810, as well as structural substrate 801 coupled to inorganic dielectric material 220 and second-level IC dies 810. Composite IC device 600 is released from adhesive layer 870 and substrate 201. FIG. 8F shows composite IC device 600 with inorganic dielectric material 220, multiple IC dies 210, 810, structural substrate 801, and now device interconnects 802 coupled to IC dies 210.

Returning to FIG. 1, a portion of inorganic dielectric material is modified in operation 150. To prepare the composite IC device for singulation, laser exposure modifies a contiguous portion of the inorganic dielectric material encircling the IC dies. The inorganic dielectric material modification extends vertically through the entire thickness of the inorganic dielectric material around the IC dies.

Figure 8G:
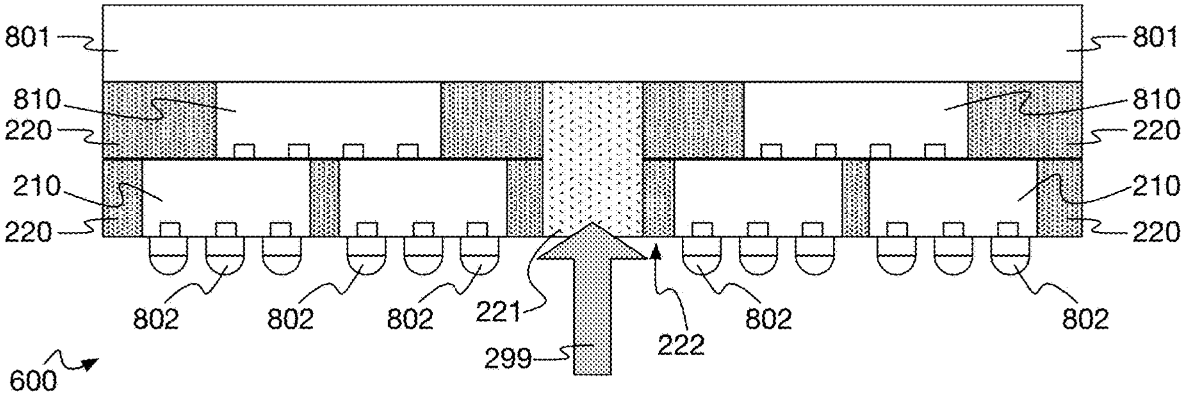

In FIG. 8G, composite IC device 600 is shown with modified portions of inorganic dielectric material 220, e.g., that have been exposed to laser energy (represented by electromagnetic radiation 299). Modified inorganic dielectric material 221 extends vertically through the entire thickness of inorganic dielectric material 220 from structural substrate 801 to a lower surface of composite IC device 600 between IC dies 210 and between second-level IC dies 810. Unmodified portions 222 of inorganic dielectric material 220 are adjacent and on both sides of IC dies 210, 810. Though not shown in FIG. 8G, similar laser exposure modifies inorganic dielectric material 220 on all sides of composite IC device 600. A contiguous body of modified inorganic dielectric material 221 encircles a perimeter of the IC dies.

Returning to FIG. 1, the modified portion of inorganic dielectric material is selectively removed in operation 160, e.g., by a wet etch, and the unmodified portion of inorganic dielectric material is retained. When the modified portion of inorganic dielectric material is removed, the substrate to be, e.g., sawn or scribed through is exposed.

Figure 8H:
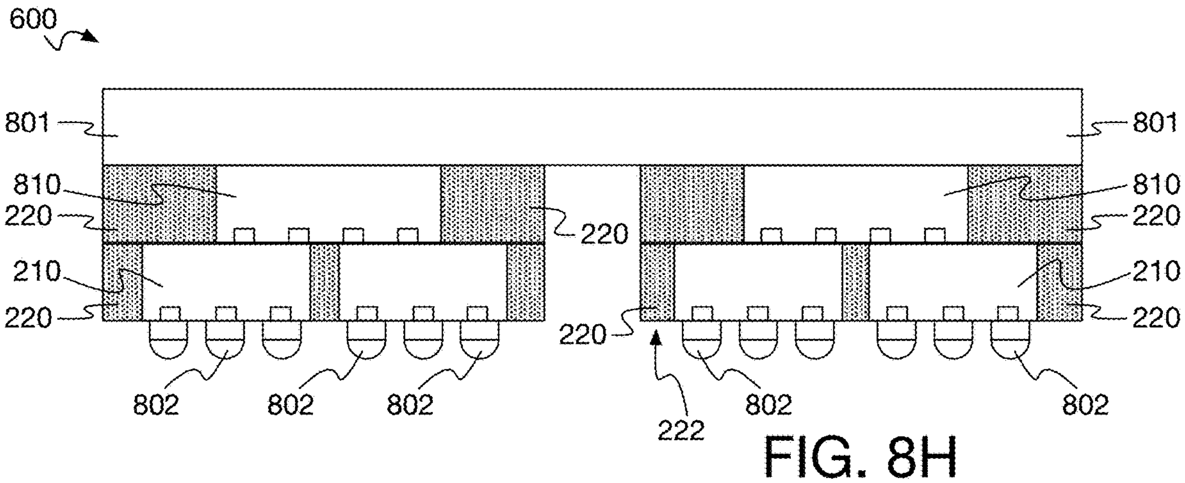

In FIG. 8H, composite IC device 600 is shown with unmodified portions of inorganic dielectric material 220 still laterally surrounding IC dies 210, 810. With modified inorganic dielectric material 221 removed, structural substrate 801 is exposed where composite IC device 600 is to be singulated. Composite IC device 600 is prepared for singulation as thick inorganic dielectric material 220 has been removed and structural substrate 801 exposed where structural substrate 801 will be e.g., sawn or scribed.

Figure 8I:
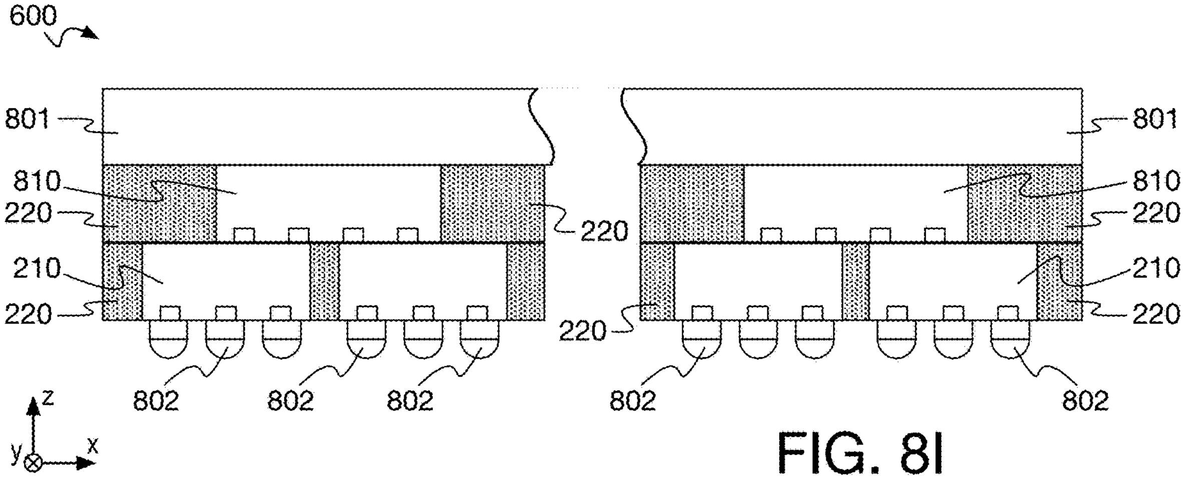

FIG. 8I shows composite IC device 600 singulated from another composite IC device 600. Structural substrate 801 has been sawn or scribed through.

Methods 100 of FIG. 1 can be used to form complex cavities in inorganic dielectric material. Inorganic dielectric material is formed over modified inorganic dielectric material, and modified inorganic dielectric material is selectively removed from under retained, unmodified portions of inorganic dielectric material, which enables non-conventional, undercut voids to be formed in inorganic dielectric material. These complex cavities can be used to form potentially large conductive structures encapsulated in inorganic dielectric material. Such structures can include, e.g., spiral inductors.

FIGS. 9A, 9B, 9C, 9D, 9E, and 9F illustrate cross-sectional profile views of composite IC device 600, including IC die 210 and inorganic dielectric material 220, at various stages of manufacture, in accordance with some embodiments. As shown in FIGS. 9A-9F, complex cavities are formed in inorganic dielectric material 220 by depositing inorganic dielectric material 220 over modified inorganic dielectric material 221 and retaining unmodified portions 222 of inorganic dielectric material 220 over selectively removed modified inorganic dielectric material 221.

Returning to FIG. 1, a composite IC device is formed in operation 120 by depositing an inorganic dielectric material over and adjacent to an IC die. Operation 120 may include operations 122 and 124, both of which will be performed here. A first thickness of inorganic dielectric material is deposited in operation 122.

Figure 9A:
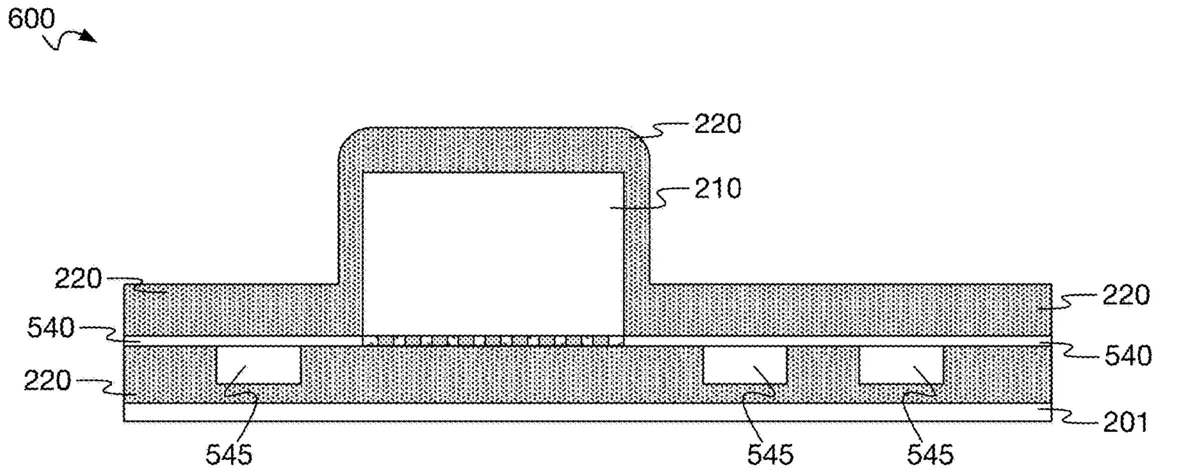
FIGS. 9A, 9B, 9C, 9D, 9E, and 9F illustrate cross-sectional profile views of composite IC device, including IC die and inorganic dielectric material, at various stages of manufacture, in accordance with some embodiments.

FIG. 9A shows composite IC device 600 with inorganic dielectric material 220 over IC die 210, which is over a substrate 201 with etch-stop layer 540 over metallization features 545.

Returning to FIG. 1, the first thickness of inorganic dielectric material is modified in operation 150 before operation 124, when the second thickness will be deposited over the modified first thickness.

Figure 9B:
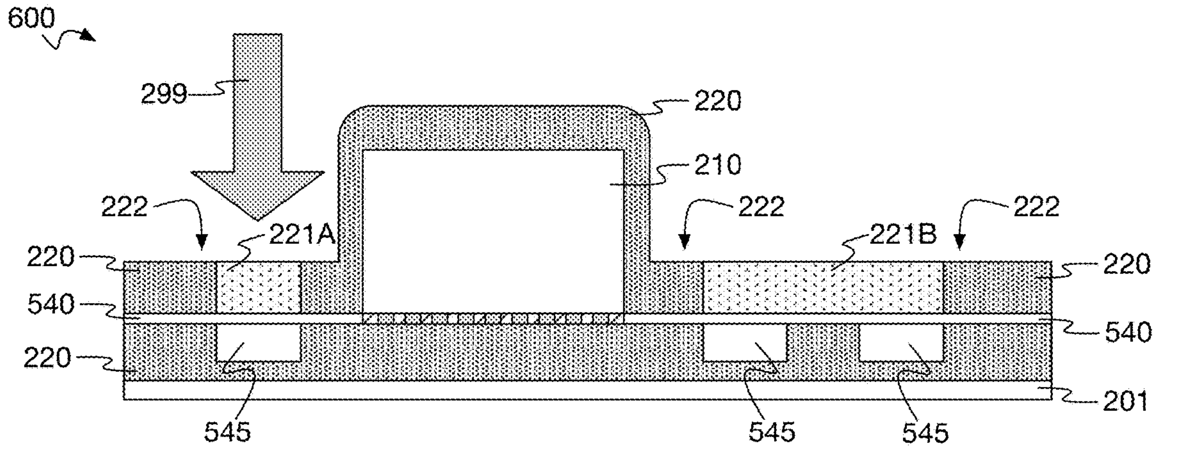

In FIG. 9B, composite IC device 600 is shown with modified inorganic dielectric material 221A, 221B, e.g., that has been exposed to laser energy (represented by electromagnetic radiation 299), over etch-stop layer 540, which may also be an anti-reflective layer. Unmodified portions 222 of inorganic dielectric material 220 remain on the sides of modified inorganic dielectric material 221A, 221B. Inorganic dielectric material 220 is over and adjacent IC die 210.

Returning to FIG. 1 following operation 150, the second thickness is deposited over the modified first thickness in operation 124.

Figure 9C:
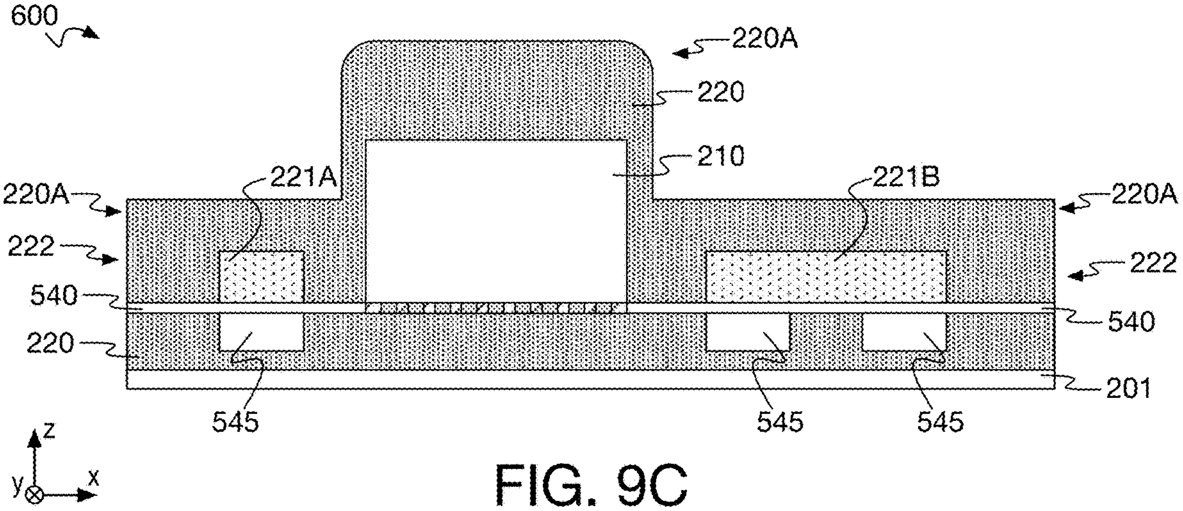

FIG. 9C shows composite IC device 600 with inorganic dielectric material 220A deposited over modified inorganic dielectric material 221A, 221B. Inorganic dielectric material 220A is also over unmodified portions 222 of inorganic dielectric material 220.

Returning to FIG. 1 following operation 124, operations can be repeated, and more inorganic dielectric material can be modified or deposited.

Figure 9D:
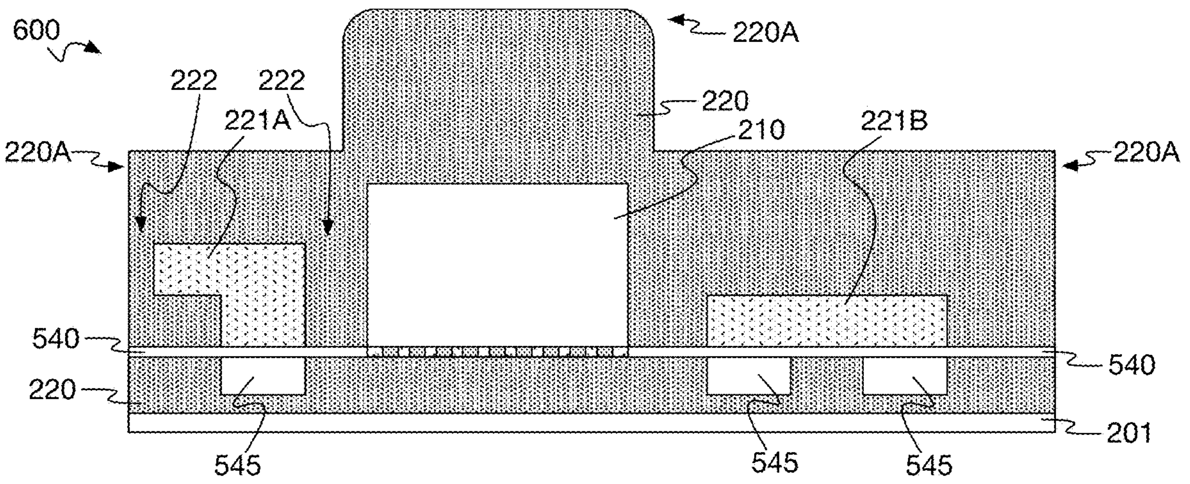

FIG. 9D shows composite IC device 600 with more inorganic dielectric material 220A deposited over modified inorganic dielectric material 221A, 221B, but not until after more inorganic dielectric material 220 was modified by laser exposure. A second layer of modified inorganic dielectric material 221A extends laterally, and inorganic dielectric material 220A is over modified inorganic dielectric material 221A, 221B, unmodified portions 222 of inorganic dielectric material 220, and IC die 210.

Figure 9E:
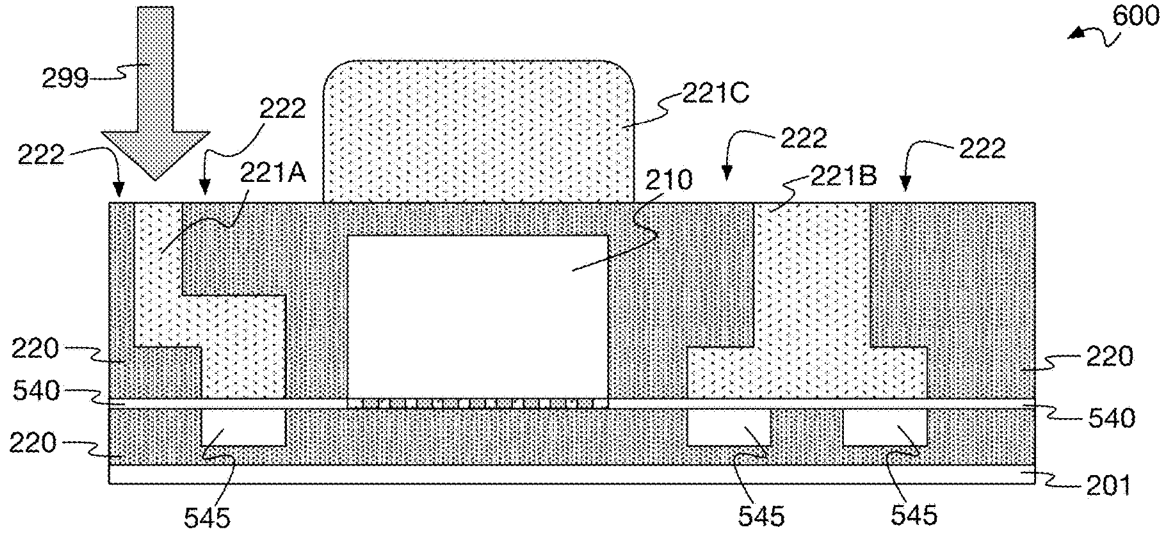

In FIG. 9E, composite IC device 600 is shown with modified inorganic dielectric material 221A, 221B, 221C, e.g., that has been exposed to laser energy (represented by electromagnetic radiation 299). Modified inorganic dielectric material 221A, 221B extends vertically to a top surface of composite IC device 600. Modified inorganic dielectric material 221C is over IC die 210 and, having been modified, can be removed.

In operation 160, a modified portion of the second thickness and the modified portion of the first thickness are both removed. At least a vertical column of modified inorganic dielectric material couples other modified inorganic dielectric material to a top surface of composite IC device 600, which is how the modified inorganic dielectric material can be removed, e.g., with a wet etch of KOH.

Figure 9F:
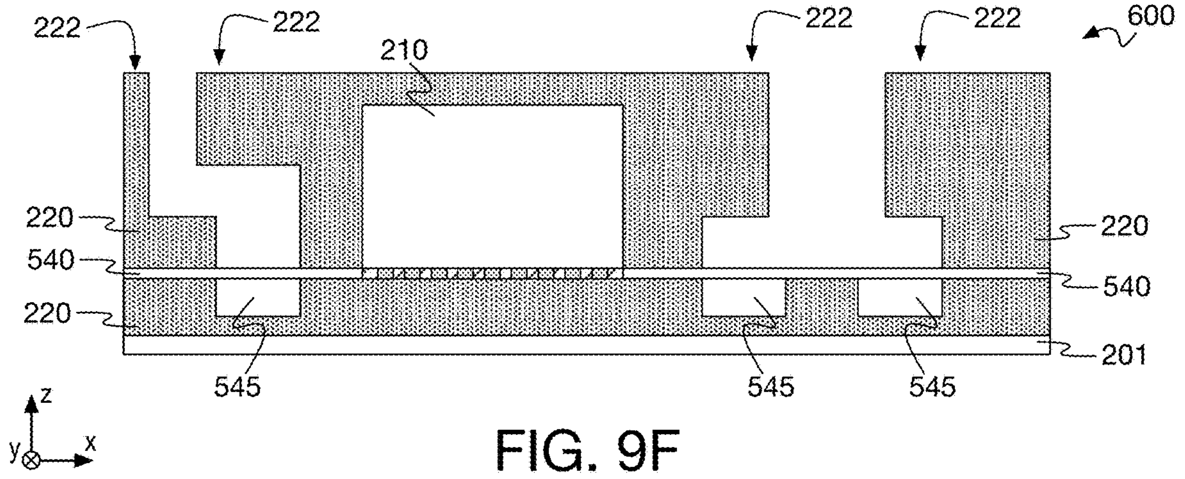

In FIG. 9F, composite IC device 600 is shown without modified inorganic dielectric material 221A, 221B, 221C. Unmodified portions 222 of inorganic dielectric material 220 are retained, including over seemingly undercut voids where modified inorganic dielectric material 221A, 221B was removed.

Figure 10:
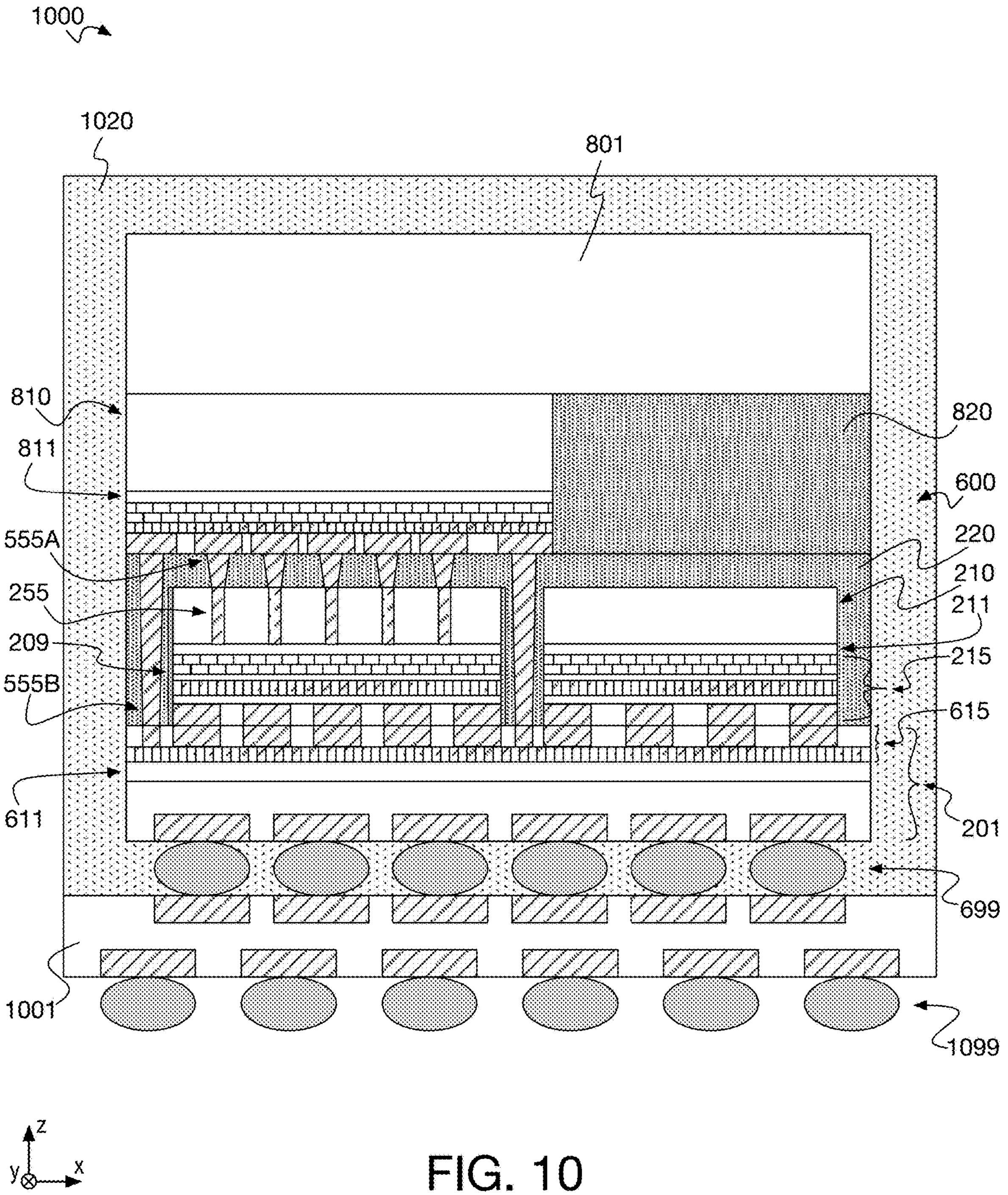
FIG. 10 illustrates a composite IC package, including a multi-die composite IC device, structural substrate, and package substrate, in accordance with some embodiments.

FIG. 10 illustrates a composite IC package 1000, including multi-die composite IC device 600, structural substrate 801, and package substrate 1001, in accordance with some embodiments. Composite IC device 600 shares at least some characteristics with other embodiments as previously described, such as in FIG. 6E. Composite IC device 600 includes at least inorganic dielectric material 220, substrate 201, and IC dies 210. IC dies 210 are hybrid bonded to substrate 201. Interface layers 209 are on either side of IC die 210. Metallization features 215 of IC dies 210 are direct bonded to metallization features 615 of substrate 201. Second-level IC die 810 is electrically coupled to IC die 210 by conductive vias 555A (and to metallization features 215 by TSVs 255). Second-level IC die 810 is electrically coupled to metallization features 615 and substrate 201 by conductive vias 555B. Second-level IC die 810 is coupled to composite IC device 600 at least at conductive vias 555A. In some embodiments, second-level IC die 810 is hybrid bonded to composite IC device 600 at least at conductive vias 555A. In some embodiments, a lower surface of second-level IC die 810 is hybrid bonded to composite IC device 600 at inorganic dielectric material 220 and conductive vias 555A. Second-level IC die 810 can be considered as part of a larger composite IC device 600 including at least IC dies 210 and inorganic dielectric material 220. In some embodiments, composite IC device 600 includes second-level IC die 810. In some embodiments, composite IC device 600 includes structural substrate 801. In some embodiments, structural substrate 801 is direct bonded to second-level IC die 810 and a second-level inorganic dielectric material 820. In some embodiments, second-level inorganic dielectric material 220 is the same material as inorganic dielectric material 220. Composite IC package 1000 includes composite IC device 600, which is encapsulated in package insulator 1020 and coupled to package substrate 1001 by device-level interconnects 699. Notably, package insulator 1020 is not an inorganic dielectric material. Composite IC device 600 is coupled to a power supply through device-level interconnects 699, package substrate 1001, and package-level interconnects 1099. IC dies 210, 810, and substrate 201 may include active devices, such as transistors, in device layers 211, 611, 811. Package substrate 1001 may include an organic material. In some embodiments, package substrate 1001 is an interposer.

Figure 11:
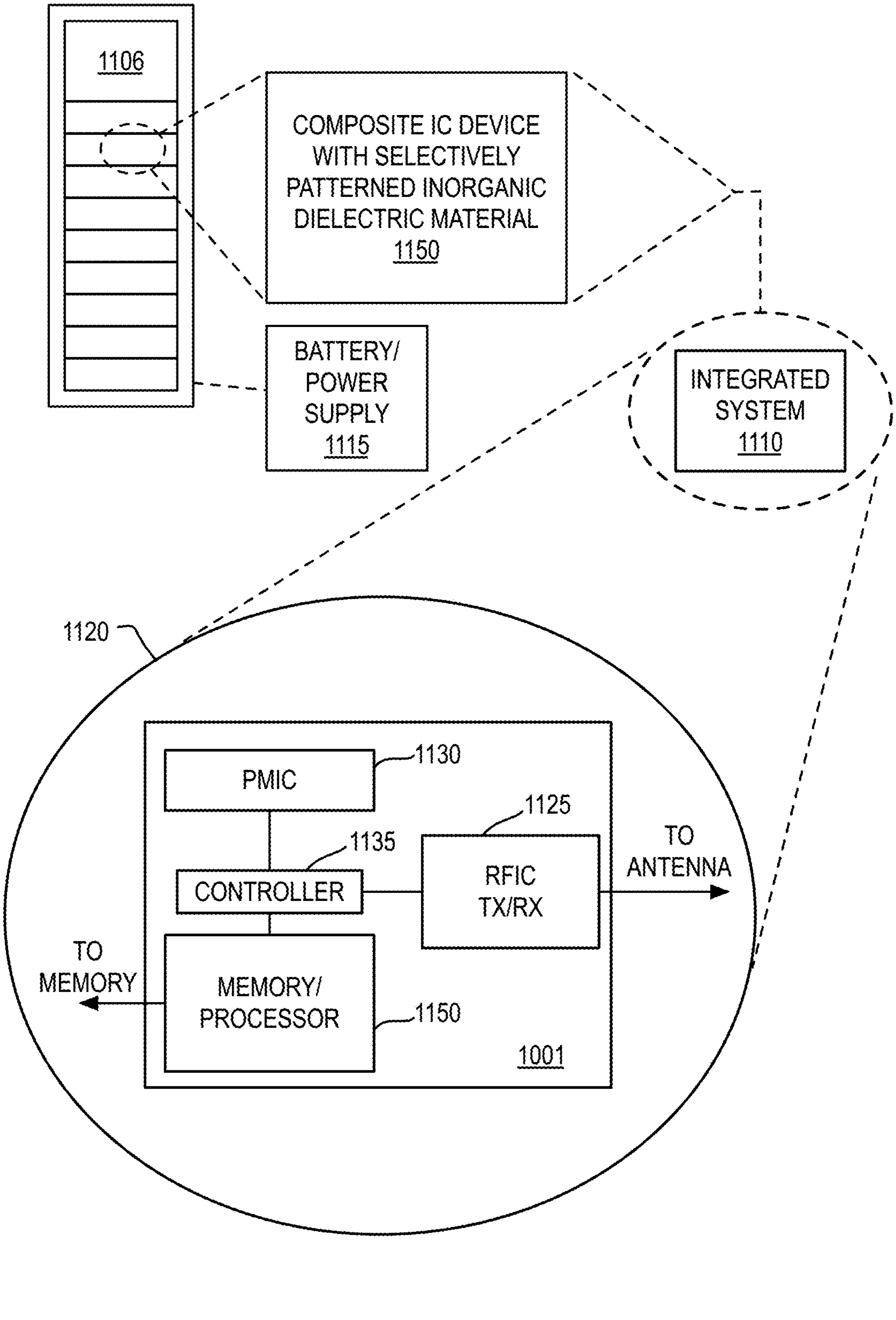
FIG. 11 illustrates a diagram of an example data server machine employing a composite IC device with selectively patterned inorganic dielectric material.

FIG. 11 illustrates a diagram of an example data server machine 1106 employing a composite IC device with selectively patterned inorganic dielectric material, in accordance with some embodiments. Server machine 1106 may be any commercial server, for example, including any number of high-performance computing platforms disposed within a rack and networked together for electronic data processing, which in the exemplary embodiment includes one or more devices 1150 having selectively patterned inorganic dielectric material.

Also as shown, server machine 1106 includes a battery and/or power supply 1115 to provide power to devices 1150, and to provide, in some embodiments, power delivery functions such as power regulation. Devices 1150 may be deployed as part of a package-level integrated system 1110. Integrated system 1110 is further illustrated in the expanded view 1120. In the exemplary embodiment, devices 1150 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1150 is a microprocessor including an SRAM cache memory. As shown, device 1150 may be a composite IC device with selectively patterned inorganic dielectric material as discussed herein. Device 1150 may be further coupled to (e.g., communicatively coupled to) a board, an interposer, or a substrate 1001 along with, one or more of a power management IC (PMIC) 1130, RF (wireless) IC (RFIC) 1125 including a wideband RF (wireless) transmitter and/or receiver (TX/RX) (e.g., including a digital baseband and an analog front end module further includes a power amplifier on a transmit path and a low noise amplifier on a receive path), and a controller 1135 thereof. In some embodiments, RFIC 1125, PMIC 1130, controller 1135, and device 1150 include a composite IC device with selectively patterned inorganic dielectric material.

Figure 12:
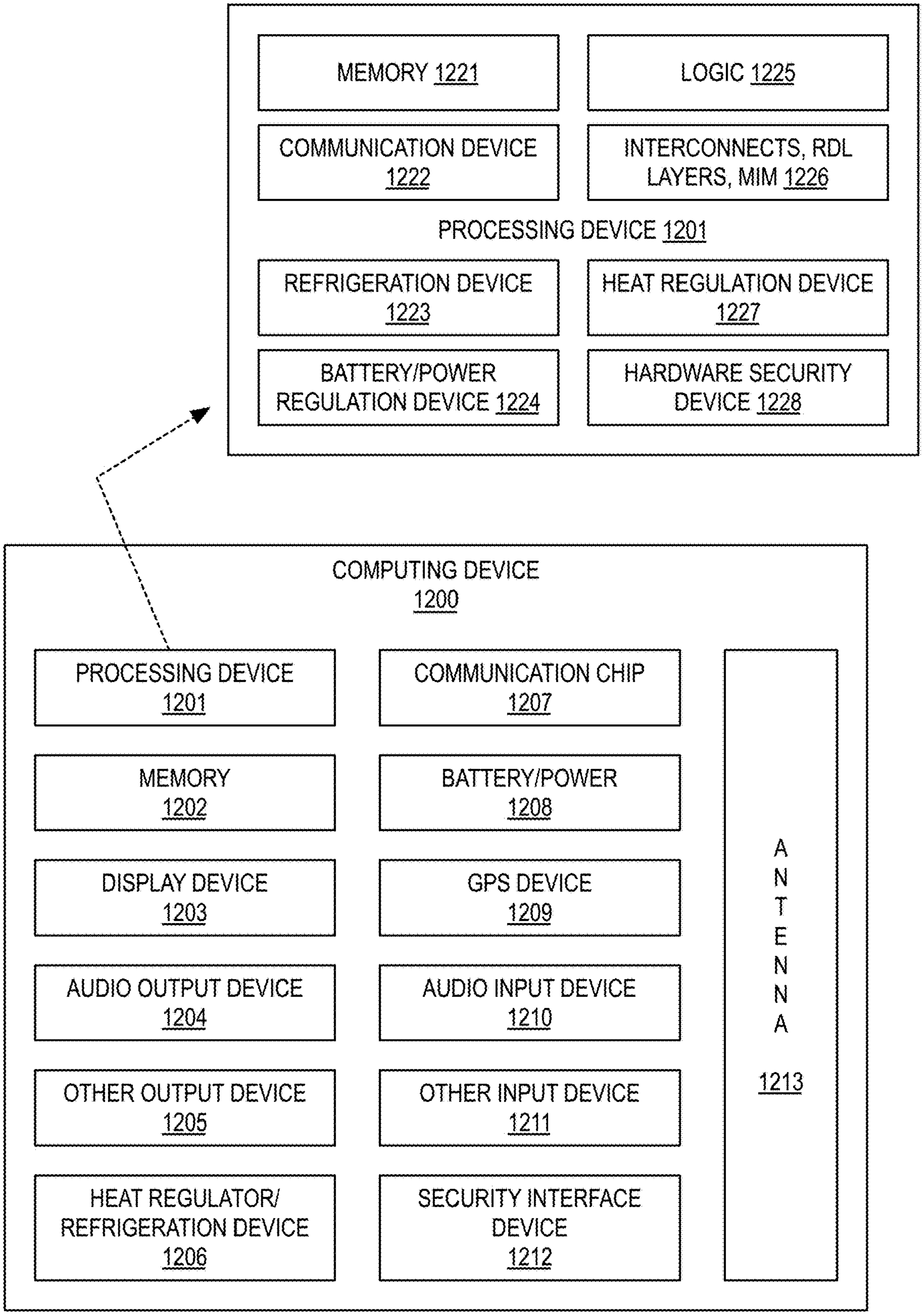
FIG. 12 is a block diagram of an example computing device, in accordance with some embodiments.

FIG. 12 is a block diagram of an example computing device 1200, in accordance with some embodiments. For example, one or more components of computing device 1200 may include any of the devices or structures discussed herein. A number of components are illustrated in FIG. 12 as being included in computing device 1200, but any one or more of these components may be omitted or duplicated, as suitable for the application. In some embodiments, some or all of the components included in computing device 1200 may be attached to one or more printed circuit boards (e.g., a motherboard). In some embodiments, various ones of these components may be fabricated onto a single system-on-a-chip (SoC) die. Additionally, in various embodiments, computing device 1200 may not include one or more of the components illustrated in FIG. 12, but computing device 1200 may include interface circuitry for coupling to the one or more components. For example, computing device 1200 may not include a display device 1203, but may include display device interface circuitry (e.g., a connector and driver circuitry) to which display device 1203 may be coupled. In another set of examples, computing device 1200 may not include an audio output device 1204, other output device 1205, global positioning system (GPS) device 1209, audio input device 1210, or other input device 1211, but may include audio output device interface circuitry, other output device interface circuitry, GPS device interface circuitry, audio input device interface circuitry, audio input device interface circuitry, to which audio output device 1204, other output device 1205, GPS device 1209, audio input device 1210, or other input device 1211 may be coupled.

Computing device 1200 may include a processing device 1201 (e.g., one or more processing devices). As used herein, the term "processing device" or "processor" indicates a device that processes electronic data from registers and/or memory to transform that electronic data into other electronic data that may be stored in registers and/or memory. Processing device 1201 may include a memory 1221, a communication device 1222, a refrigeration device 1223, a battery/power regulation device 1224, logic 1225, interconnects 1226 (i.e., optionally including redistribution layers (RDL) or metal-insulator-metal (MIM) devices), a heat regulation device 1227, and a hardware security device 1228.

Processing device 1201 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 1200 may include a memory 1202, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1202 includes memory that shares a die with processing device 1201. This memory may be used as cache memory and may include embedded dynamic random-access memory (eDRAM) or spin transfer torque magnetic random-access memory (STT-MRAM).

Computing device 1200 may include a heat regulation/refrigeration device 1206. Heat regulation/refrigeration device 1206 may maintain processing device 1201 (and/or other components of computing device 1200) at a predetermined low temperature during operation.

In some embodiments, computing device 1200 may include a communication chip 1207 (e.g., one or more communication chips). For example, the communication chip 1207 may be configured for managing wireless communications for the transfer of data to and from computing device 1200. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1207 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1207 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1207 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1207 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1207 may operate in accordance with other wireless protocols in other embodiments. Computing device 1200 may include an antenna 1213 to facilitate wireless communications and/or to receive other wireless communications (such as AM or FM radio transmissions).

In some embodiments, communication chip 1207 may manage wired communications, such as electrical, optical, or any other suitable communication protocols (e.g., the Ethernet). As noted above, communication chip 1207 may include multiple communication chips. For instance, a first communication chip 1207 may be dedicated to shorter-range wireless communications such as Wi-Fi or Bluetooth, and a second communication chip 1207 may be dedicated to longer-range wireless communications such as GPS, EDGE, GPRS, CDMA, WiMAX, LTE, EV-DO, or others. In some embodiments, a first communication chip 1207 may be dedicated to wireless communications, and a second communication chip 1207 may be dedicated to wired communications.

Computing device 1200 may include battery/power circuitry 1208. Battery/power circuitry 1208 may include one or more energy storage devices (e.g., batteries or capacitors) and/or circuitry for coupling components of computing device 1200 to an energy source separate from computing device 1200 (e.g., AC line power).

Computing device 1200 may include a display device 1203 (or corresponding interface circuitry, as discussed above). Display device 1203 may include any visual indicators, such as a heads-up display, a computer monitor, a projector, a touchscreen display, a liquid crystal display (LCD), a light-emitting diode display, or a flat panel display, for example.

Computing device 1200 may include an audio output device 1204 (or corresponding interface circuitry, as discussed above). Audio output device 1204 may include any device that generates an audible indicator, such as speakers, headsets, or earbuds, for example.

Computing device 1200 may include an audio input device 1210 (or corresponding interface circuitry, as discussed above). Audio input device 1210 may include any device that generates a signal representative of a sound, such as microphones, microphone arrays, or digital instruments (e.g., instruments having a musical instrument digital interface (MIDI) output).

Computing device 1200 may include a GPS device 1209 (or corresponding interface circuitry, as discussed above). GPS device 1209 may be in communication with a satellite-based system and may receive a location of computing device 1200, as known in the art.

Computing device 1200 may include other output device 1205 (or corresponding interface circuitry, as discussed above). Examples of the other output device 1205 may include an audio codec, a video codec, a printer, a wired or wireless transmitter for providing information to other devices, or an additional storage device.

Computing device 1200 may include other input device 1211 (or corresponding interface circuitry, as discussed above). Examples of the other input device 1211 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1200 may include a security interface device 1212. Security interface device 1212 may include any device that provides security measures for computing device 1200 such as intrusion detection, biometric validation, security encode or decode, access list management, malware detection, or spyware detection.

Computing device 1200, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The subject matter of the present description is not necessarily limited to specific applications illustrated in FIGS. 1-12. The subject matter may be applied to other deposition applications, as well as any appropriate manufacturing application, as will be understood to those skilled in the art.

The following examples pertain to further embodiments, and specifics in the examples may be used anywhere in one or more embodiments.

In one or more first embodiments, a method includes forming an IC device by depositing an inorganic dielectric material over, or adjacent to, an IC die, modifying a portion of the inorganic dielectric material through laser exposure, and removing a modified portion of the inorganic dielectric material selectively to an unmodified portion of the inorganic dielectric material.

In one or more second embodiments, further to the first embodiments, the modifying and the removing reduces surface topography of the inorganic dielectric material.

In one or more third embodiments, further to the first or second embodiments, the method further includes measuring the surface topography of the inorganic dielectric material prior to the modifying, and adjusting a characteristic of the laser exposure based on a measurement of the surface topography.

In one or more fourth embodiments, further to the first through third embodiments, the modifying includes modifying a portion of the inorganic dielectric material that is over the IC die, and the removing retains an unmodified portion of the inorganic dielectric material that is adjacent to the IC die.

In one or more fifth embodiments, further to the first through fourth embodiments, the modifying includes modifying a contiguous portion of the inorganic dielectric material encircling a perimeter of the IC die, the modified portion extending vertically through a thickness of the inorganic dielectric material, and the removing exposes a substrate coupled to the IC die.

In one or more sixth embodiments, further to the first through fifth embodiments, the method further includes depositing a first thickness of the inorganic dielectric material and depositing a second thickness of the inorganic dielectric material over the first thickness, the modifying includes modifying the first thickness of the inorganic dielectric material before depositing the second thickness of inorganic dielectric material, and the removing includes removing a first modified portion of the second thickness and a second modified portion of the first thickness.

In one or more seventh embodiments, further to the first through sixth embodiments, the modifying and the removing forms a via opening or trench within the inorganic dielectric material, and the method further includes depositing conductive material into the via opening or trench, and planarizing a surface of the conductive material with a surface of the unmodified portion of the inorganic dielectric material.

In one or more eighth embodiments, further to the first through seventh embodiments, the modifying includes modifying a portion of the inorganic dielectric material that is between the IC die and a second IC die adjacent to the first IC die, and wherein the removing reduces surface topography of the inorganic dielectric material retained between the IC die and the second IC die.

In one or more ninth embodiments, further to the first through eighth embodiments, the forming includes forming a portion of the inorganic dielectric material over an interface layer, and further including modifying a portion of the interface layer through laser exposure, and removing the portion of the inorganic dielectric material over the modified portion of the interface layer.

In one or more tenth embodiments, an IC device includes an IC die, an inorganic dielectric material over, or adjacent to, the IC die, and a conductive via within the inorganic dielectric material and electrically coupled to a metallization feature of the IC die or adjacent to the IC die, wherein a depth profile of the conductive via includes a region of a larger via width between ridges of a smaller via width.

In one or more eleventh embodiments, further to the tenth embodiments, the inorganic dielectric material has a substantially homogenous composition.

In one or more twelfth embodiments, further to the tenth or eleventh embodiments, the inorganic dielectric material includes a plurality of bilayers and wherein each of the regions of larger via width are within a thickness of a first of the bilayers and each of the regions of smaller via width are within a thickness of a second of the bilayers.

In one or more thirteenth embodiments, further to the tenth through twelfth embodiments, the inorganic dielectric material includes a first layer including predominantly silicon and nitrogen in contact with the IC die and a second layer over the first layer, the second layer including predominantly silicon and oxygen.

In one or more fourteenth embodiments, further to the tenth through thirteenth embodiments, the conductive via is a first conductive via extending through a first thickness of the inorganic dielectric material and is in contact with a metallization feature of the IC die, the IC device further includes a second conductive via adjacent to the IC die, the second conductive via extends through the first thickness and through a second thickness of the inorganic dielectric material, below the first thickness, and the first and second thicknesses of inorganic dielectric material are of a substantially homogeneous composition.

In one or more fifteenth embodiments, further to the tenth through fourteenth embodiments, the conductive via is a first conductive via of a first depth and in contact with a metallization feature of the IC die, and a second conductive via of a second depth, at least twice the first depth, is in contact with a metallization feature adjacent to the IC die, and wherein the inorganic dielectric material surrounding both the first and second conductive vias is of a substantially homogeneous composition.

In one or more sixteenth embodiments, further to the tenth through fifteenth embodiments, the inorganic dielectric material surrounding both the conductive line and the conductive via is substantially homogeneous.

In one or more seventeenth embodiments, an IC device includes an inorganic dielectric material over, or adjacent to, an IC die, and a conductive via in contact with a conductive line, wherein a compositionally homogenous region of the inorganic dielectric material surrounds both the conductive via and the conductive line.

In one or more eighteenth embodiments, further to the seventeenth embodiments, the conductive via is a first conductive via of a first depth and in contact with a metallization feature of the IC die, a second conductive via of a second depth, at least twice the first depth, is in contact with a metallization feature adjacent to the IC die; and the inorganic dielectric material surrounding both the first and second conductive vias is of a substantially homogeneous composition.

In one or more nineteenth embodiments, further to the seventeenth or eighteenth embodiments, within the first and second depths, neither of the first or second conductive vias passes through an etch stop layer having a composition distinct from the inorganic dielectric material.

In one or more twentieth embodiments, further to the seventeenth through nineteenth embodiments, a depth profile of the conductive via includes regions of a larger via width between ridges of a smaller via width.

In one or more twenty-first embodiments, further to the seventeenth through twentieth embodiments, a length of the conductive line includes regions of wider line width between ridges of narrower line width.

In one or more twenty-second embodiments, further to the seventeenth through twenty-first embodiments, an interface layer is adjacent the IC die and the inorganic dielectric material.

The disclosure can be practiced with modification and alteration, and the scope of the appended claims is not limited to the embodiments so described. For example, the above embodiments may include specific combinations of features. However, the above embodiments are not limiting in this regard and, in various implementations, the above embodiments may include the undertaking only a subset of such features, undertaking a different order of such features, undertaking a different combination of such features, and/or undertaking additional features than those features explicitly listed. The scope of the patent rights should, therefore, be determined with reference to the appended claims, along with the full scope of equivalents to which such claims are entitled.

We claim:

1. A method, comprising:

forming an integrated circuit (IC) device by depositing an inorganic dielectric material over, and between, a first IC die and an adjacent second IC die, wherein the inorganic dielectric material comprises predominantly silicon and oxygen;

modifying, through laser exposure, a top surface of a first portion of the inorganic dielectric material that is over both the first IC die and the second IC die without modifying a top surface of a second portion of the inorganic dielectric material that is between the first IC die and the second IC die; and planarizing the IC device by chemically etching the first portion of the inorganic dielectric material selectively to the second portion of the inorganic dielectric material that is between the first IC die and the second IC die.

2. The method of claim 1, wherein modifying and removing the first portion of the inorganic dielectric material reduces surface topography of the inorganic dielectric material by reducing a thickness of the inorganic dielectric material that is over the first IC die and the second IC die.

3. The method of claim 2, wherein the inorganic dielectric material is silicon dioxide.

4. The method of claim 1, wherein removing the first portion of the inorganic dielectric material exposes a surface of at least one of the first IC die or second IC die.

5. A method, comprising:

depositing an inorganic dielectric material over, and adjacent to, an IC die;

modifying, through laser exposure, a portion of the inorganic dielectric material adjacent to the IC die, a modified portion extending vertically through a thickness of the inorganic dielectric material; and removing the modified portion of the inorganic dielectric material adjacent to the IC die, wherein the removing exposes a substrate coupled to the IC die.

6. The method of claim 5, further comprising:

depositing a second thickness of the inorganic dielectric material after modifying the portion of the inorganic dielectric material adjacent to the IC die;

modifying a portion of the second thickness of the inorganic dielectric material before removing the portion of the inorganic dielectric material adjacent to the IC die; and removing the portion of the second thickness of the inorganic dielectric material along with the portion of the inorganic dielectric material adjacent to the IC die.

7. The method of claim 5, wherein modifying and removing the portion of the inorganic dielectric material adjacent to the IC die forms a via opening or trench within the inorganic dielectric material, and the method further comprises:

depositing conductive material into the via opening or trench.

8. The method of claim 5, wherein the modifying further comprises modifying a portion of the inorganic dielectric material that is over the IC die and wherein the method further comprises planarizing the inorganic dielectric material by removing the portion of the inorganic dielectric material that is over the IC die.

9. The method of claim 6, wherein:

modifying and removing the portion of the inorganic dielectric material adjacent to the IC die forms a first via opening or trench within a first thickness of the inorganic dielectric material; and modifying and removing the portion of the second thickness of inorganic dielectric material forms a second via opening or trench within the second thickness of the inorganic dielectric material, the second via opening overlapping the first via opening.

10. The method of claim 6, wherein depositing the inorganic dielectric material forms a mesa of the inorganic dielectric material over the IC die; and the method further comprises:

modifying, through laser exposure, the mesa of inorganic dielectric material; and removing the mesa of the inorganic dielectric material concurrently with removing the portion of the inorganic dielectric material adjacent to the IC die.

11. The method of claim 5, further comprising singulating the IC die by sawing or scribing through the exposed substrate.

12. A method of forming an integrated circuit (IC) device, the method comprising:

conformally depositing silicon dioxide adjacent to, and over, an IC die that is coupled to an underlying substrate;

modifying, through laser exposure, a first portion of the silicon dioxide that is over the IC die without modifying a second portion of the silicon dioxide that is adjacent to the IC die; and planarizing the IC device by chemically etching the first portion of the silicon dioxide while retaining the second portion of the silicon dioxide that is adjacent to the IC.

13. The method of claim 12, further comprising:

forming a via or trench exposing the substrate by modifying and etching a third portion of the silicon dioxide that is over the substrate; and depositing a metal into the via or trench.

* * * * *